(12) United States Patent
Bailey

(10) Patent No.: US 9,943,012 B2
(45) Date of Patent: Apr. 10, 2018

(54) MODULAR APPLICATION OF PERIPHERAL PANELS AS EXPANSION SLEEVES AND CABLE MANAGEMENT COMPONENTS WITHIN A RACK-BASED INFORMATION HANDLING SYSTEM

(71) Applicant: DELL PRODUCTS, L.P., Round Rock, TX (US)

(72) Inventor: Edmond Bailey, Cedar Park, TX (US)

(73) Assignee: Dell Products, L.P., Round Rock, TX (US)

( * ) Notice: Subject to any disclaimer, the term of this patent is extended or adjusted under 35 U.S.C. 154(b) by 0 days.

(21) Appl. No.: 15/213,928

(22) Filed: Jul. 19, 2016

(65) Prior Publication Data
US 2016/0330870 A1  Nov. 10, 2016

Related U.S. Application Data

(63) Continuation of application No. 14/139,802, filed on Dec. 23, 2013, now Pat. No. 9,451,729.

(51) Int. Cl.
| H05K 7/20 | (2006.01) |
| G06F 1/20 | (2006.01) |
| H05K 7/14 | (2006.01) |
| H05K 7/18 | (2006.01) |
| H05K 9/00 | (2006.01) |

(52) U.S. Cl.
CPC ........... *H05K 7/20736* (2013.01); *G06F 1/20* (2013.01); *H05K 7/1487* (2013.01); *H05K 7/1491* (2013.01); *H05K 7/1492* (2013.01); *H05K 7/183* (2013.01); *H05K 9/0062* (2013.01)

(58) Field of Classification Search
None
See application file for complete search history.

(56) References Cited

U.S. PATENT DOCUMENTS

| 6,327,139 B1 * | 12/2001 | Champion | H02B 1/202 |
| | | | 174/69 |
| 8,605,435 B1 * | 12/2013 | Ashby | G06F 1/20 |
| | | | 361/690 |
| 9,468,126 B2 * | 10/2016 | Pronozuk | H05K 7/1488 |
| 2005/0117376 A1 * | 6/2005 | Wilson | G06F 1/263 |
| | | | 363/142 |

(Continued)

*Primary Examiner* — Dimary Lopez Cruz
*Assistant Examiner* — Zhengfu Feng
(74) *Attorney, Agent, or Firm* — Isidore PLLC

(57) ABSTRACT

A rack-based information handling system (RIHS) includes: a rack chassis having a plurality of interconnected panels forming a volumetric space having a front section and a rear section, both with opposing side panels forming a front access space and a rear access space, respectively, between corresponding opposing side panels; one or more IT gear sleds that are inserted into the front section of the rack chassis; and a pair of front expansion panels that are added to the rack chassis and which extend past an end of the opposing side panels at the front section of the rack chassis to provide a deeper IT bay within the front section and enable insertion of longer-than-standard depth IT gear within the rack chassis. The front expansion panels are cable management panels that include at least one strap that is utilized to secure one or more cables extending from one or more IT gear inserted into the rack chassis.

19 Claims, 15 Drawing Sheets

(56) References Cited

U.S. PATENT DOCUMENTS

| | | | |
|---|---|---|---|
| 2008/0108231 A1* | 5/2008 | Caveney | H01R 9/2416 |
| | | | 439/76.1 |
| 2009/0213544 A1* | 8/2009 | Dittus | H05K 7/20727 |
| | | | 361/695 |
| 2010/0147554 A1 | 6/2010 | Ong et al. | |
| 2010/0258350 A1* | 10/2010 | Hallett | H05K 7/1491 |
| | | | 174/99 R |
| 2011/0242788 A1* | 10/2011 | Jaze | H05K 9/0018 |
| | | | 361/818 |
| 2012/0194350 A1* | 8/2012 | Crisp | H05K 7/1498 |
| | | | 340/815.42 |
| 2013/0107424 A1* | 5/2013 | Thomas | H05K 7/1489 |
| | | | 361/679.01 |

* cited by examiner

MODULAR APPLICATION OF PERIPHERAL PANELS AS EXPANSION SLEEVES AND CABLE MANAGEMENT COMPONENTS WITHIN A RACK-BASED INFORMATION HANDLING SYSTEM

RELATED APPLICATIONS

This application is a continuation of and claims priority from U.S. patent application Ser. No. 14/139,802, filed Dec. 23, 2013, the entire contents of which are incorporated herein by reference.

BACKGROUND

1. Technical Field

The present disclosure generally relates to information handling systems and in particular to modular, expandable rack-based information handling systems and design.

2. Description of the Related Art

As the value and use of information continue to increase, individuals and businesses seek additional ways to process and store information. One option available to users is information handling systems. An information handling system (IHS) generally processes, compiles, stores, and/or communicates information or data for business, personal, or other purposes, thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Large scale information handling systems are typically deployed in a physical structure referred to as a rack. A rack-based IHS typically includes a plurality of standard height and width IT gear that are inserted into an open chassis created by the frame of the rack. The connecting power and communication cables of these IT gear are then run from a first connector of the IT gear to a second, terminating connector or point on or off the rack, creating a bunch of hanging and/or loping cables running in-between the IT gears and other components of the rack in a non-organized fashion throughout the rack chassis. The conventional racks are designed with a specific depth that accommodates the standard depth IT gear being inserted in the rack, such that the communication and power cables connecting to the IT gear extend outside of the rack cabinet at the back and/or front of the rack. As more and more IT gear are added, the supporting cables are run indiscriminately throughout the rack, such that the collection of cables can result in an unsightly tangle of cables.

Additionally, certain IT gear within a rack may require additional security from physical theft, or manipulation, or re-configuration, while that IT gear is deployed in the rack. However, security of components within a physical rack-based IHS and security of the rack itself are often limited to maintaining the rack within a locked facility, with limited access to specific personnel. There is currently no mechanism for providing physical security of the individual rack components themselves, e.g., a specific block of servers, a storage sled, or other IT gear, to limit physical access to only select personnel of the larger number of people who may have access to the rack facility.

BRIEF SUMMARY

Disclosed are a rack-based information handling system (RIHS) including: a rack chassis having a plurality of interconnected panels forming a volumetric space having a front section and a rear section, both with opposing side panels forming a front access space and a rear access space, respectively, between corresponding opposing side panels; one or more IT gear sleds that are inserted into the front section of the rack chassis and which extend beyond an end of the opposing side panels when fully inserted into the front section of the rack chassis; and a pair of front expansion panels that are added to the rack chassis and which extend past an end of the opposing side panels at the front section of the rack chassis to provide a deeper IT bay within the front section and enable insertion of longer-than-standard depth IT gear within the rack chassis.

In one embodiment, the pair of front expansion panels are retractable sleeves and the rack chassis comprises sleeve guides fixed to the opposing side panels and to which the retractable sleeves are attached to enable sliding of the retractable sleeves from an extended position to a retracted position and vice versa.

In one or more embodiments, the opposing side panels and front expansion panels respectively include attachment affordances and connection affordances to support interconnection of the front expansion panels with the opposing side panels. Also, the pair of front expansion panels are removably affixed via the connecting affordances to the opposing side panels in a fixed position that provides an extended depth of the front section of the rack chassis. The pair of front expansion panels flank an extended portion of the one or more IT gear sleds and provide shielding from electromagnetic interference (EMI) for the extended portion of the one or more IT gears within the IT gear sleds. The pair of front expansion panels further include a plurality of perforations within a surface of the front expansion panels and which enable convection air cooling of the one or more IT gear within the extended portion.

In one or more embodiments, the front expansion panels are cable management panels which comprise: at least one strap attached to each of the cable management panels that is utilized to secure one or more cables extending from one or more IT gear inserted into the rack chassis, where the one or more cables are pulled out of a main section of the front access space towards a corresponding side of the front section. The at least one strap is flexible and is made of a pliable material from a group comprising: a wire, a string, a textile, and a pliable plastic. In at least one embodiment, the cable management panels are segmented panels that are less than a total height of the rack chassis.

According to one aspect, the RIHS includes: a power and management module (PMM) having one or more power supply units (PSUs) and a management controller and which is inserted into a power bay of the rack chassis, where the PMM includes two cable routing panels located within the interior sides of the PMM and which are utilized to route a plurality of power cables connecting each PSU at a front section of the rack chassis with an AC switch box located at a rear section of the rack chassis.

According to another aspect, the RIHS also includes a cable management bar affixed to a back section of the rack chassis in a vicinity of a power and management bay of the rack assembly, the cable management bar having one or more straps connected to the cable management bar and which can be utilized to group and arrange one or more cables running in the vicinity of the power and management bay.

According to yet another aspect, the RIHS includes: one or more IT sleds having a movable tray and a stationary tray, the IT sled further having a cable extension arm connected at one end to the moveable tray and at another end to an internal rear panel of the IT sled; and at least a first sled of the one or more IT sleds further including connecting and communication cables internal to the sled and affixed to the cable extension arm, where the connecting and communication cables remain attached to the cable extension arm to allow the movable tray to be extracted from the IT sled into a hot serviceable, open position and retracted back into the IT sled into a closed position.

In at least one embodiment, the RIHS includes: a pair of rear expansion panels that are added to the rack chassis and which extend past an end of the opposing side panels at the back section of the rack chassis to provide a deeper power and fan bay within the back section and enable insertion of longer-than-standard depth fan modules within the fan bay.

The above summary contains simplifications, generalizations and omissions of detail and is not intended as a comprehensive description of the claimed subject matter but, rather, is intended to provide a brief overview of some of the functionality associated therewith. Other systems, methods, functionality, features and advantages of the claimed subject matter will be or will become apparent to one with skill in the art upon examination of the following figures and detailed written description.

BRIEF DESCRIPTION OF THE DRAWINGS

The description of the illustrative embodiments can be read in conjunction with the accompanying figures. It will be appreciated that for simplicity and clarity of illustration, elements illustrated in the figures have not necessarily been drawn to scale. For example, the dimensions of some of the elements are exaggerated relative to other elements. Embodiments incorporating teachings of the present disclosure are shown and described with respect to the figures presented herein, in which.

DETAILED DESCRIPTION

Figure 1:
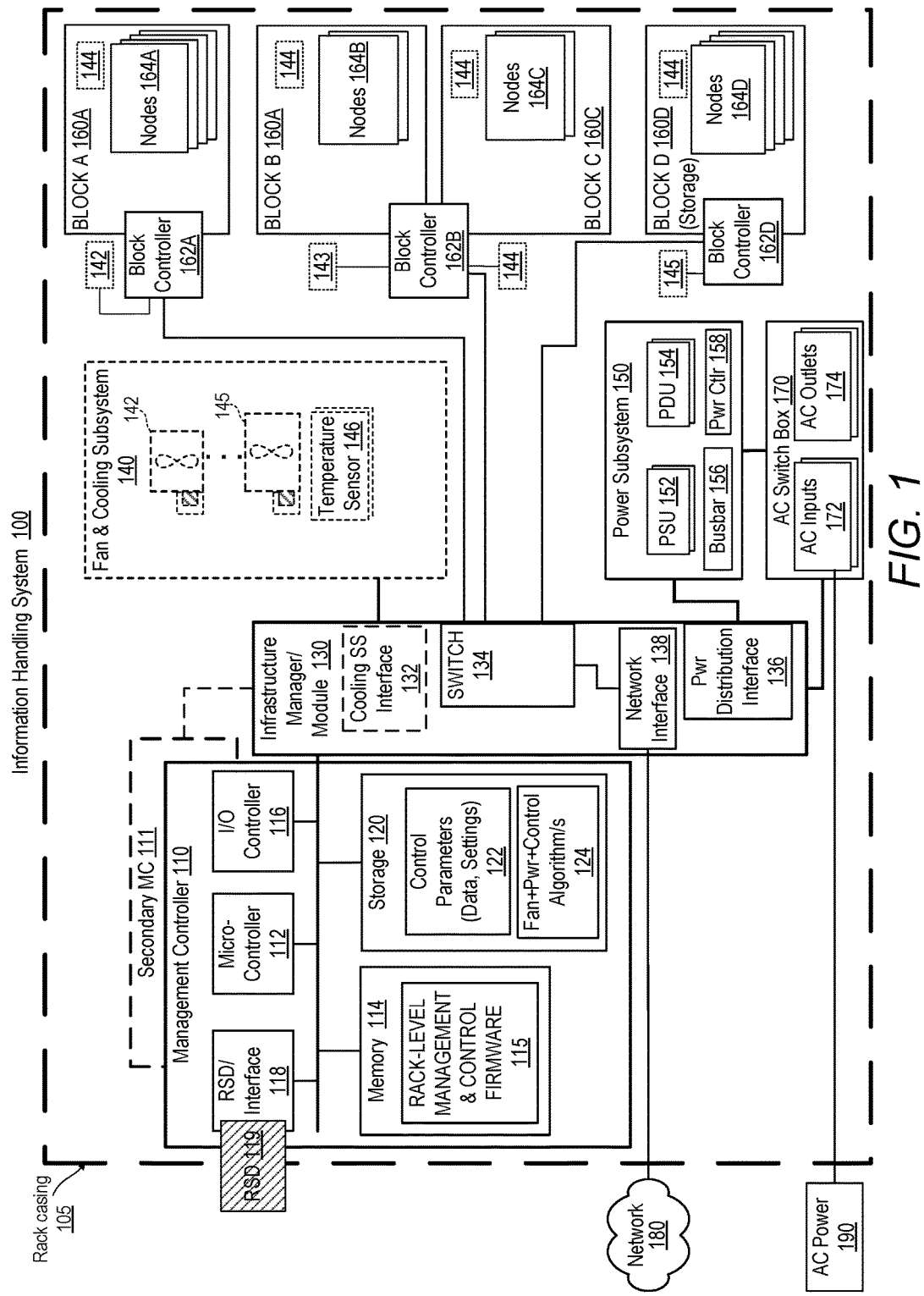
FIG. 1 is a two-dimensional block diagram illustration of an example modular, scalable, and expandable (MSE) rack-based information handling system (RIHS), within which the various features of the disclosure can be advantageously implemented, according to at least one embodiment of the disclosure.

The illustrative embodiments provide various aspects of an information handling system rack and corresponding rack-based information handling system that are modular, scalable, and expandable and includes modular application of cable management panels and security access screens.

According to a first aspect, the rack-based information handling system (RIHS) includes: a rack chassis having a plurality of interconnected panels forming a volumetric space having a front section and a rear section, both with opposing side panels forming a front access space and a rear access space, respectively, between corresponding opposing side panels; one or more IT gear sleds that are inserted into the front section of the rack chassis; and a pair of front expansion panels that are added to the rack chassis and which extend past an end of the opposing side panels at the front section of the rack chassis to provide a deeper IT bay within the front section and enable insertion of longer-than-standard depth IT gear within the rack chassis. The front expansion panels are cable management panels that include at least one strap that is utilized to secure one or more cables extending from one or more IT gear inserted into the rack chassis.

According to a second aspect, the rack-based information handling system (RIHS) includes a rack chassis having at least two opposing side panels which are structurally held in place by one or more segments spanning between the two opposing side panels to generate an internal volume between the at least two opposing side panels. The internal volume has structures that enable insertion and retention of information technology (IT) gear and other components of the IHS at one of a front access space and a rear access space of the rack chassis that extend between the two opposing side panels. The RIHS also includes at least one security screen that is removably affixed to opposing edges of the two opposing side panels and span across a first segment of an access space to prevent direct physical access to the IT gear or other components that are inserted within the rack chassis behind the security screen.

In the following detailed description of exemplary embodiments of the disclosure, specific exemplary embodiments in which the disclosure may be practiced are described in sufficient detail to enable those skilled in the art to practice the disclosed embodiments. For example, specific details such as specific method orders, structures, elements, and connections have been presented herein. However, it is to be understood that the specific details presented need not be utilized to practice embodiments of the present disclosure. It is also to be understood that other embodiments may be utilized and that logical, architectural, programmatic, mechanical, electrical and other changes may be made without departing from general scope of the disclosure. The following detailed description is, therefore, not to be taken in a limiting sense, and the scope of the present disclosure is defined by the appended claims and equivalents thereof.

References within the specification to "one embodiment," "an embodiment," "embodiments", or "one or more embodiments" are intended to indicate that a particular feature, structure, or characteristic described in connection with the embodiment is included in at least one embodiment of the present disclosure. The appearance of such phrases in various places within the specification are not necessarily all referring to the same embodiment, nor are separate or alternative embodiments mutually exclusive of other embodiments. Further, various features are described which may be exhibited by some embodiments and not by others. Similarly, various requirements are described which may be requirements for some embodiments but not other embodiments.

It is understood that the use of specific component, device and/or parameter names and/or corresponding acronyms thereof, such as those of the executing utility, logic, and/or firmware described herein, are for example only and not meant to imply any limitations on the described embodiments. The embodiments may thus be described with different nomenclature and/or terminology utilized to describe the components, devices, parameters, methods and/or functions herein, without limitation. References to any specific protocol or proprietary name in describing one or more elements, features or concepts of the embodiments are provided solely as examples of one implementation, and such references do not limit the extension of the claimed embodiments to embodiments in which different element, feature, protocol, or concept names are utilized. Thus, each term utilized herein is to be given its broadest interpretation given the context in which that terms is utilized.

Further, those of ordinary skill in the art will appreciate that the hardware components and basic configuration depicted in the various figures (e.g. FIG. 1) and described herein may vary. For example, the illustrative components within RIHS 100 (FIG. 1) are not intended to be exhaustive, but rather are representative to highlight components that can be utilized to implement various aspects of the present disclosure. For example, other devices/components/modules may be used in addition to or in place of the hardware and software modules depicted. The depicted examples do not convey or imply any architectural or other limitations with respect to the presently described embodiments and/or the general disclosure.

FIG. 1 illustrates a block diagram representation of the various components that make up an example rack-based information handling system (RIHS) 100, within which one or more of the described features of the various embodiments of the disclosure can be implemented. For purposes of this disclosure, an information handling system, such as RIHS 100, may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a server, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Referring specifically to FIG. 1, there is illustrated a two-dimensional block diagram of an example rack-based IHS (RIHS) 100 configured within a modular, expandable rack with modular configuration of various functional components inserted therein. As a two-dimensional image, certain of the presented components are shown in different orientations relative to each other for simplicity in describing the connectively of the components. For example, while certain components are shown separate from the power subsystem, in actual implementation, these components can be located on or within a power bay housing several of the components of the power subsystem. Similarly, while the power subsystem is shown with specific components within a single block, these components are not necessarily contained in a unitary structure. For example, the bus bar can be modularly extended along the entire vertical run of the rack with only one sub-section in direct connection with or located within or proximate to the actual power bay. For purposes of the disclosure, all general references to an information handling system shall refer to the RIHS 100, while references to actual processing nodes within the RIHS 100 are understood to refer to chassis-level processing nodes or other IT gear that can be located on physical sleds within the various blocks defined within the rack. It is further appreciated that within the RIHS 100 can be multiple, separate domains or computing systems that operate independent of each other and can be assigned to different independent customers and/or users. Even when configured as separate computing systems, however, the RIHS provides rack-level power management and control of these systems as a unitary RIHS. The level of detail of the actual use of the processing nodes within the general rack-level RIHS 100 is not relevant to the descriptions provided herein and are specifically omitted. For clarity, a single RIHS 100 is illustrated. However, a RIHS may include multiple racks. For example, one rack may contain only storage sleds with other racks providing computing nodes. In an exemplary embodiment, components of the RIHS 100 are organized into a hierarchy as described in TABLE A below.

TABLE A

| Level | Device/Module | Acronym | Comments |
|---|---|---|---|
| Domain Level | Management Controller | MC | In front of Power Bay |
| Domain Level | Infrastructure module | IM | In rear of Power Bay |
| Domain Level | AC Switch Box | ACSB | Behind network switches |
| Domain Level | Power Bay Power Module | PBPM | Connects to 10 supplies and two MCs. Designed by Delta |
| Domain Level | Power Bay | Power Bay | Holds PBPM, MCx2, IM, & ACSB |
| Block Level | Block Controller | BC | Hot Plug Fan Controller + Serial & Node Interface |
| Block Level | Block Controller Distribution Board (BCDB) | BCDB | Fixed in Block |
| Block Level | Power Interface Board | PIB | Columns of 4 nodes |
| Block Level | Temperature Probe Board | TPB | Ambient Temperature Sensor |
| Node Level | Node Power Distribution Board | NPDB | In each node |
| Node Level | 4 drive HDD BP | x4HDDBP | Used in 12 drive FW HP sled |
| Node level | 2 drive HDD PB | x2HDDBP | Used for HP 2.5" in HW sled |

As presented in FIG. 1, RIHS 100 comprises rack casing 105, which can comprise one or more panels of sheet metal or other material interconnected to form a three dimensional volume generally referred to in the industry as a rack. Unique aspects of the rack casing 105, which add to the modularity and expandability of RIHS 100 are further illustrated and described in various ones of the figures which follow, beginning with FIG. 2. As is further presented by these isometric figures, certain components of the RIHS are located internal to the rack casing 105 while other components can be attached to or be located external to or extend from rack casing 105. RIHS 100 comprises a hierarchical arrangement of multiple management modules, along with power and cooling components, and functional processing components or IT gear located within end nodes. The various functional components within RIHS are communicatively connected to one or more other components via power and communication cables, which are generally represented by the connecting lines of FIG. 1. At the rack level, RIHS 100 includes management controller (MC) 110 communicatively connected to infrastructure manager (IM) 130. MC 110 includes a microcontroller 112 (also generally referred to as a processor) which is coupled via an internal bus to memory 114, I/O interface controller 116, removable storage device (RSD) interface 118 and storage 120. Memory 114 can be flash or other form of memory. Illustrated within memory 114 is rack-level power management and control (RPMC or PMC) firmware 115, which is inclusive of the firmware that controls the operation of MC 110 in communicating with and managing the down-stream components (i.e., IT blocks and processing nodes, etc.) of RIHS 100. I/O interface 116 provides connection points and hardware and firmware components that allow for user interfacing with the MC 110 via one or more connected I/O devices, such as a keyboard, a mouse, and a monitor. I/O interface 116 enables a user to enter commands via, for example, a command line interface (CLI), and to view status information of RIHS 100. I/O interface 116 also enables the setting of operating parameters for RIHS 100, among other supported user inputs.

RSD interface 118 enables insertion or connection of a RSD 119, such as an SD card containing pre-programmable operating firmware for RIHS 100. In at least one embodiment, a RSD 119 stores a copy of the operating parameters of RIHS 100, and the RSD 119 can then be utilized to reboot the RIHS 100 to its operating state following a system failure or maintenance shutdown. Storage 120 can be any form of persistent storage and can store therein different types of data and operating parameters (settings) 122 utilized for functional operation of RIHS 100. Among the stored content within storage 120 can also be algorithms 124 utilized for fan and/or for power control or for general control of RIHS 100. In one or more embodiments, RIHS 100 can optionally include at least one other MC, illustrated as secondary MC 111, to provide a redundant configuration of MCs 110,111, which, in one embodiment, are both simultaneously active and functioning. With this embodiment, the redundant configuration and parallel operation of MCs 110/111 enables RIHS 100 to continue operating following a failure of either of the MCs 110/111 or in the event one of the MCs 110/111 has to be taken offline for maintenance.

Infrastructure manager 130 includes cooling subsystem interface 132, Ethernet switch 134, power distribution interface 136, and network interface 138. Network interface 138 enables RIHS 100 and specifically the functional components within RIHS 100 to connect to and communicate with or via an external network 180.

In addition to the above-described MC 110 and IM 130, RIHS 100 further comprises fan and cooling subsystem 140, power subsystem 150, and a plurality of IT blocks 160, individually labeled as blocks A-D 160A-160D. In one implementation, each block 160 has an associated block controller (BC) 162, which provides block level control of the IT components within the block. The dashed outline of cooling subsystem 140 is provided as a representation that cooling subsystem 140 is not an actual physical structure within RIHS 100 but is rather catch-all illustration of a collection of different modules that are located at different physical areas within RIHS 100. The relative locations and/or connectivity of these components are further illustrated by their respective connectivity to different block controllers 162, which are dispersed throughout RIHS and which control the cooling features of respective blocks of processing nodes. As illustrated, cooling subsystem 140 includes a plurality of fan modules, of which a first fan module 142 and a second fan module 145 are shown. These fan modules 142, 143, 144, and 145 are located within a respective fan bay (not shown) and can be different sizes and provide different numbers of fans per module. Also included within cooling subsystem 140 is a plurality of temperature sensors 146, which are further shown distributed within or associated with specific blocks 160. Cooling of RIHS 100 can be completed by cooling subsystem 140 along with certain design features of rack casing 105, such as perforations for air flow and other design features, which are not expanded upon further as they are not germane to the core inventive concepts provided herein. As alluded to by the dashed boxes representing the individual fan modules 142-145, each fan module 142-145 is located behind (or in the air flow path of) a specific IT block 160 and the fan modules 142-145 are communicatively coupled to and controlled by the block controller 162 associated with that block 160.

Within each block 160 is at least one, and likely a plurality of, processing nodes 164. As one aspect of the disclosure, the number of processing nodes that can be placed within each block and/or supported by a single block controller can vary up to a maximum number (e.g., 16) based on the block dimension relative to the size and configuration of each processing node and the maximum number of node-to-block connections supported by the particular block controller. Additionally, as provided by block D 160D, one or more of the blocks can be utilized to provide rack-storage of storage devices. Also, as shown with blocks B 160B and C 160C, a single block controller 162B can be assigned to control multiple blocks, when the number of processing nodes within a single individual block does not exceed the maximum downstream nodes that can be individually controlled by the particular BC (i.e., the BC node threshold). In at least one implementation, the BC node threshold can be set to 16 processing nodes. Each node controlled by a respective BC 162 is communicatively coupled to the BC 162 via one or more cables (not shown).

Figure 8:
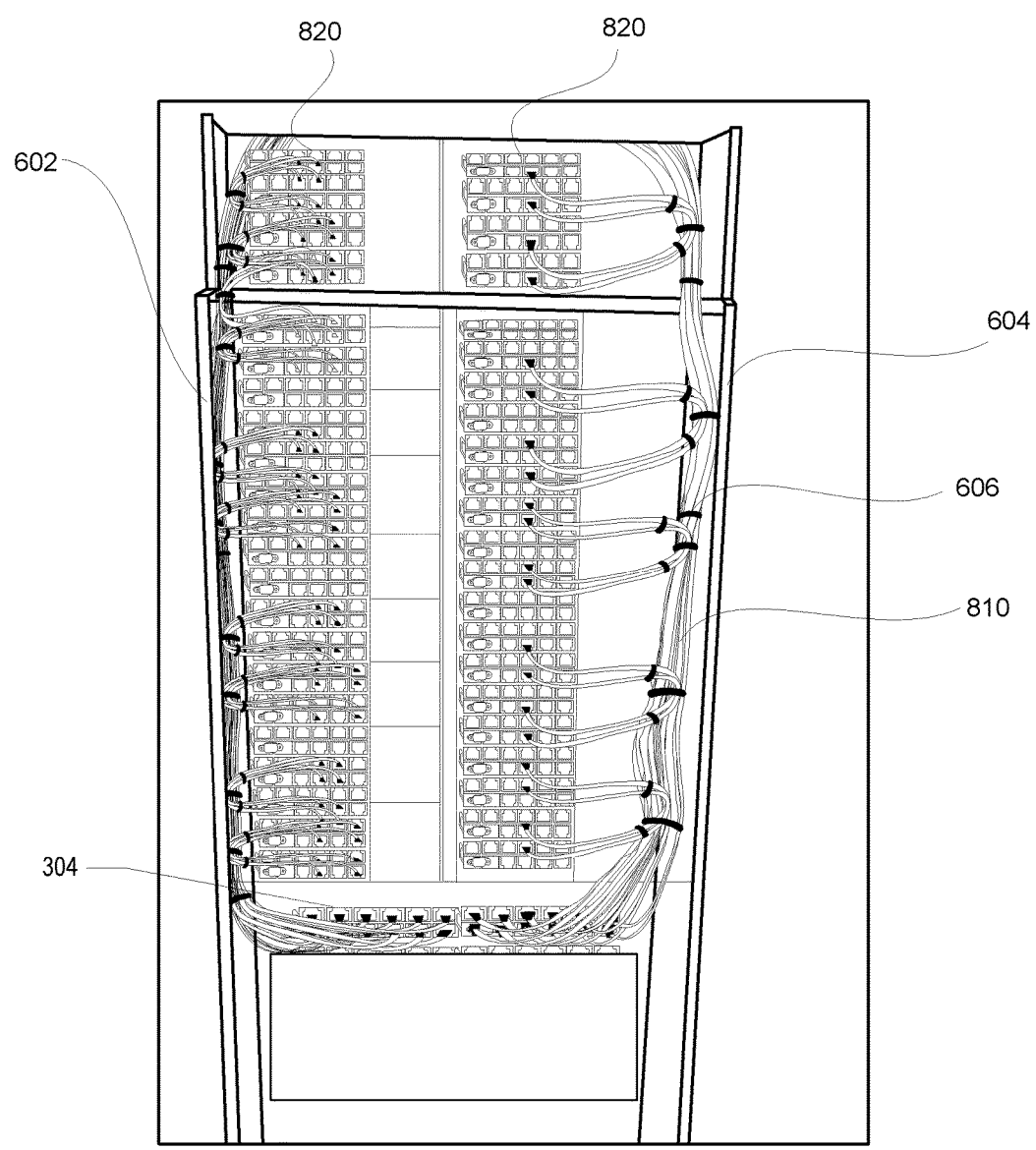
FIG. 8 illustrates the use of the cable management components (or ties) of the cable management panels to manage routing of communication cables attached to IT gear inserted within the rack chassis, according to one embodiment.

Switch 134 enables MC 110 to communicate with block controllers 162 via a network of Ethernet cables (see FIG. 8, for example). Specifically, according to at least one embodiment, MC 110 provides certain control and/or management signals to BCs 162 via one or more select wires within the existing Ethernet cables. These select wires are one or more of the additional wires within the Ethernet cable that are not typically utilized for normal Ethernet communication.

Power subsystem 150 generally includes a plurality of power supply units (PSUs) 152, one or more power distribution units 154, and a modular busbar 156. Control of the power subsystem 150 can, in one embodiment, be provided by a separate power controller 158, separate from MC 110. Power subsystem also includes a source of external power, assumed to be AC power 190, which is provided via an AC switch box 170. AC switch box 170 is communicatively coupled to both IM 130 and power subsystem 150. AC switch box 170 includes a plurality of AC inputs 172 and a plurality of AC outlets 174 that are utilized to supply power to the PSUs, and other functional components of RIHS 100 that require AC power.

In at least one embodiment, each of the individual nodes and other components within RIHS 100 that require DC power (or less than the full complement of AC power) are either directly coupled to modular busbar 156 or coupled via power cables to PDUs 154 to obtain power. As one aspect of power distribution within RIHS 100, MC 110 can monitor power consumption across the RIHS 100 as well as the amount of available power provided by the functional PSUs 152 and trigger changes in power consumption at the block level and ultimately at the (processing) node level based on changes in the amount of available power and other factors.

Other features and functionality of RIHS 100 will be described in greater detail hereafter with reference to one or more of the following figures, with ongoing reference to FIG. 1. As one of the primary aspects of the disclosure, RIHS 100 provides a modular, scalable and/or expandable IT rack that is configured for concurrent installation of different types and different dimensions of IT gear. The IT gear can be placed in different length IT sleds, which can in turn be placed within IT block chassis. Notably, as one further aspect, the IT gear (which can include processing nodes, storage sleds, and other functional components) can have different height, width, and depth dimensions. Specifically, the rack chassis can be configured and/or re-configured during assembly or while functioning in the field to support multiple IT gear standards, such as different GUs, SSi standards, etc.

Figure 2:
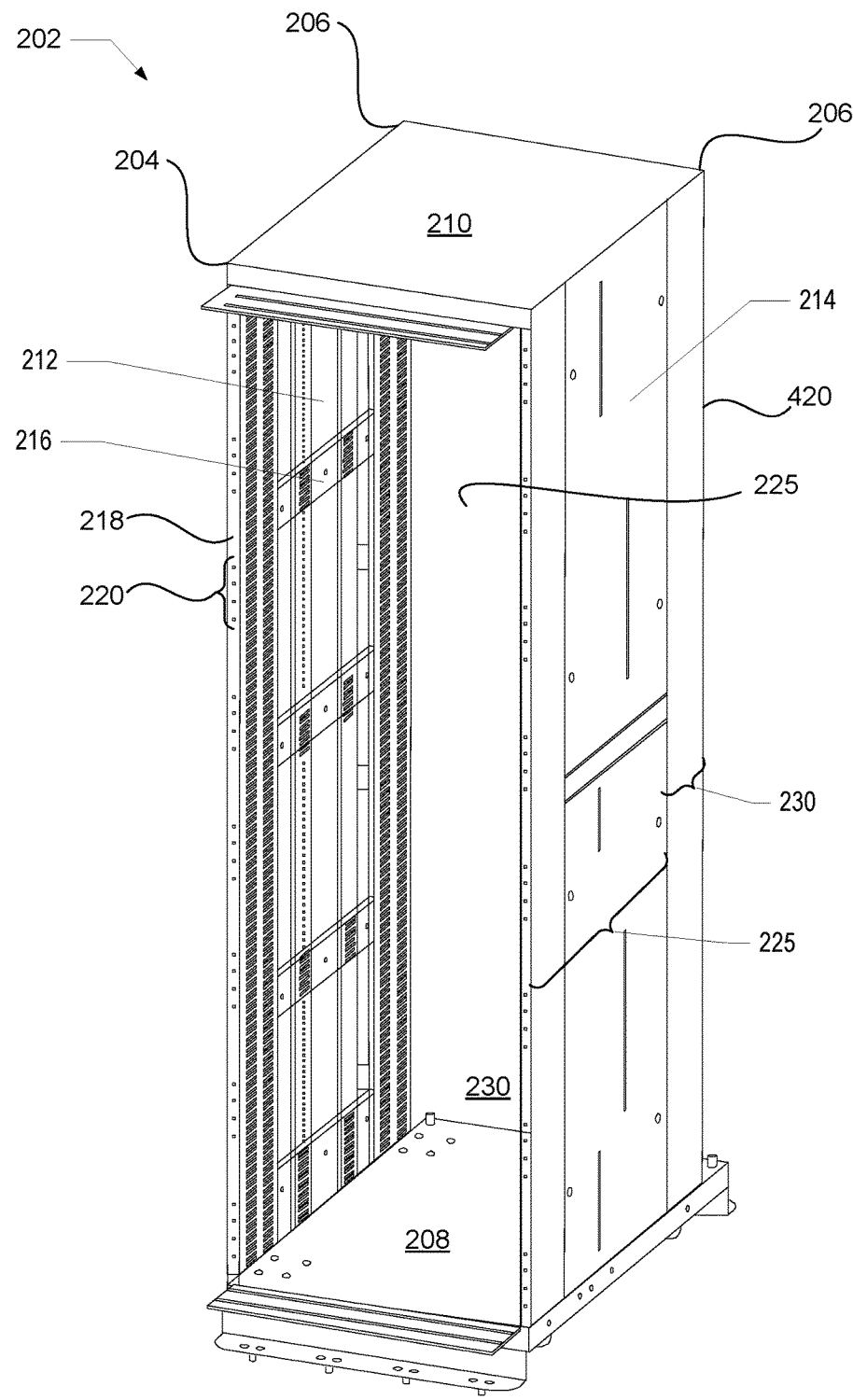
FIG. 2 provides a front view of a three-dimensional representation of the rack chassis or cabinet of an example RIHS that can be configured with the features described herein, according to one embodiment.

Referring now to FIG. 2, there is illustrated a front isometric view of a bare-bones representation of a rack chassis 202. As shown, rack chassis 202 is made up of a base structure comprising a plurality of interconnected panels forming a volumetric space having a front section (generally 204) and a rear section (generally 206). The interconnected panels are collectively referred to as rack casing 105 in FIG. 1 and include opposing side panels 212, 214, a base panel 208 and a top panel 210. Opposing side panels 212, 214 of rack chassis 202 run parallel to each other from front section 204 to rear section 206 to form a front access space 225 and a rear access space 230, respectively, between corresponding opposing side panels 212, 214. A plurality of guides 216, which run in a same direction from the front section 204 towards the rear section 206, are located within interior surfaces of the opposing side panels 212, 214 at the front section 204. In the illustrated embodiment, the front surface 218 of the opposing side panels 212, 214 includes attachment affordances 220, which are shown as groupings of perforations or holes. The attachment affordances 220 are utilized to provide structural support to hold one or more sleeves or expansion panels (see FIGS. 5 and 6) that can be attached to the opposing side panels 212, 214 of rack chassis 202. In one embodiment, the expansion panels include attachment mechanisms (see 608, FIG. 6) that allow the expansion panels to be fixably mated to corresponding ones of the opposing side panels 212, 214. Other forms of attachment affordances 220 can be utilized in alternate embodiments. Additionally, the attachment affordances 220 can be located on the exterior side or inner side of the opposing side panels 212, 214, in alternate embodiments.

Figure 3:
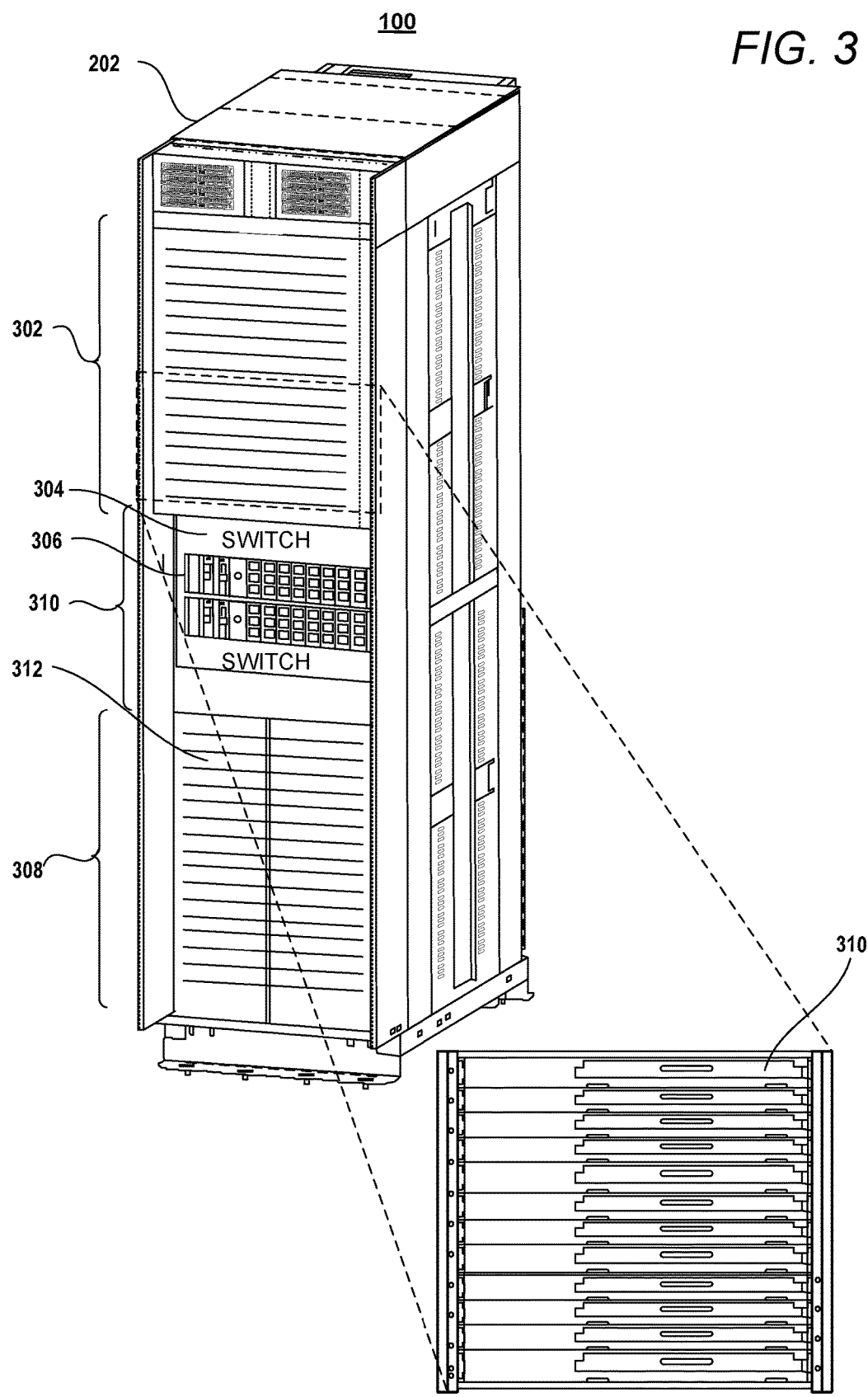
FIG. 3 provides a front view of an example MSE RIHS including blocks of processing nodes and the power and management modules inserted within the rack chassis of FIG. 2, according to one embodiment.
Figure 4:
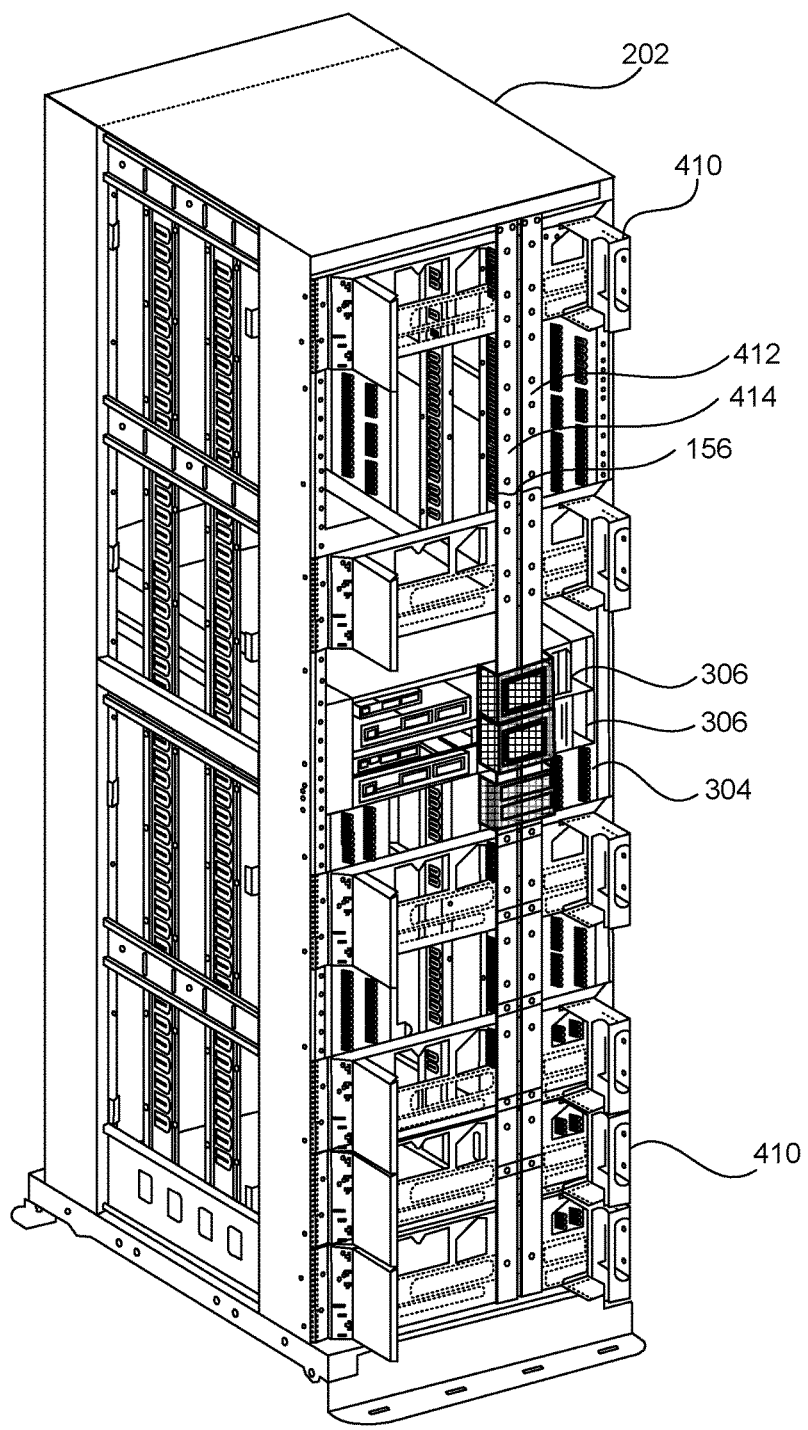
FIG. 4 provides a rear view of the MSE RIHS illustrating aspects of the modular configuration of fan bays and power subsystems, according to one or more embodiments.

Rack chassis 202 is configured to receive functional components, including IT gear, power modules and other components. FIGS. 3 and 4, respectively, provide a front and a rear isometric view of example RIHS 100 designed using rack chassis 202. FIG. 3 depicts a vertical segmentation of functional components within rack chassis 202. As shown, within RIHS 100 are an upper section 302 of full width IT sleds 310 containing IT gear, and a lower section 308 of half-width IT sleds 312 containing half-width IT gear. Located between the two banks of IT gear within a central location of rack chassis 202 are first and second switch bays 304 and two power bays 306 at a central location of the rack chassis 202. In at least one embodiment, the IT gear within the sleds 310, 312 can be server nodes or storage device, such as HDDs. The features of the present disclosure are fully applicable regardless of the configuration of the sleds that are inserted within the rack chassis 202.

Turning now to FIG. 4, there is illustrated a three-dimensional rear isometric view of RIHS 100. Rear isometric view 400 of RIHS 100 provides a plurality of fan bays 410 within which one or more fan modules (not shown) can be inserted for cooling of IT gear inserted at the front access space. Also illustrated are the back portions of the power bays and switch bays, respectively, housing power and management module (PMM) 306 and switch 304. Extending along the entire height of the back of rack chassis 202 is a segmented modular bus bar 156, having a positive terminal 412 and a ground terminal 414. As one aspect of the disclosure, the unique manner in which the modular bus bar 156 is assembled together and the specific functional use of the modular bus bar 156 allows for a reduction in the amount of power cables required within RIHS 100, as one benefit of the presented configuration. Other benefits are provided, but are not germane to the present disclosure. The fan bays are indented relative to the external walls of the rack chassis 202 to allow for flushed connection of one or more expansion sleeves to the rear side panels of the rack chassis 202.

The above descriptions of the physical and/or structural components of the RIHS 100 and/or rack chassis 202 collectively provide a modular, scalable/expandable (MSE) rack assembly for physically supporting components of one or more IT gear, such as processing or server nodes, storage devices, and the like which are inserted into the rack chassis via respective IT sleds. As illustrated by FIGS. 2-4, with ongoing reference to FIG. 1, a rack assembly includes: an external rack chassis 202 made up of sheet metal or some other structural material that maintains a rigid shape when assembled. The rack assembly further includes: a power bay located within a segment of the rack and within which one or more power bay modules can be slideably inserted. Within the power bay is inserted a power bay module having at least one cable routing channel extending there-through. As one aspect of the RIHS 100, the rack assembly has a modular structure that supports insertion of different numbers and sizes of information technology (IT) gear. The rack assembly further includes a fan bay receptacle attached to the rack and which supports insertion of multiple different configurations of fan modules.

Figure 5:
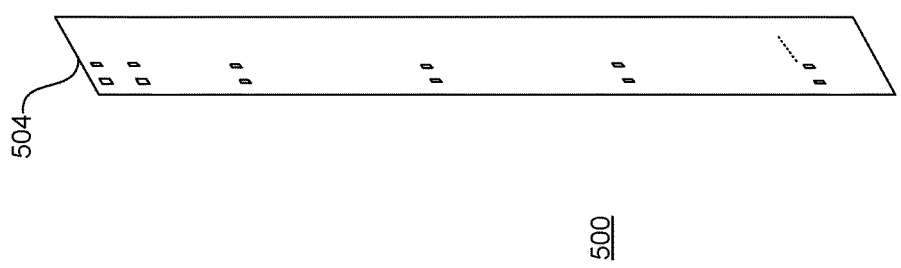
FIG. 5 illustrates example expansion side panels designed for extending a depth of a front portion of the external casing of the rack chassis, in accordance with one or more embodiments.
Figure 5:
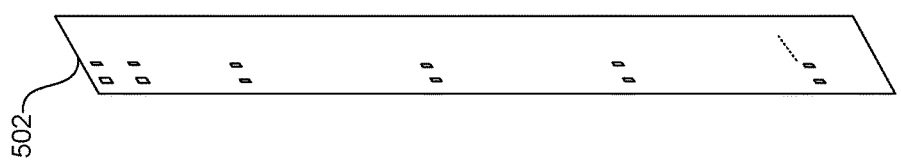

A. Modular Peripheral Panels for Cable Management (i) Expansion Side Panels/Sleeves According to one aspect of the disclosure and as illustrated by FIG. 5, RIHS 100 can be configured with opposing pairs of expansion side panels 500, which includes a left expansion side panel 502 and a right expansion side panel 504. In one embodiment, these expansion side panels 500 represent pairs of sleeves that translate forward and backwards in a lateral direction within the front access space 204 of rack chassis 202. Side panels 500 are then utilized to enable rack chassis 202 to accommodate insertion of IT sleds of different lengths, and particularly IT sleds having a depth dimension, when inserted within the front section 204 of rack chassis, that extends beyond the front access space 225 of the rack chassis 202. FIG. 5 illustrates examples of these panels 500 provided solely to accommodate longer depth IT sleds. The mechanism for attaching the expansion side panels 500 to the opposing side panels 212, 214 can vary, but includes a glide mechanism attached to the opposing side panels 212, 214 when the expansion side panels 500 are attached as laterally moveable sleeves. Expansion side panels 500 can be made of the same material as opposing side panels 212, 214, or of a completely different material. Expansion side panels 500 are preferably light weight, but durable. In at least one embodiment, and as provided by the inclusion of perforations or holes within each expansion side panel 500, expansion side panels 500 are designed to provide both proper cooling channels for the inserted IT gear. Expansion side panels 500 also provide EMI containment by shielding the otherwise exposed front sides of the inserted IT gear. With this use of a moveable sleeve, the main IT sled bay (extending within front section 204) remains the same depth for all sleds, with longer sleds being protected by having a modular sleeve pair placed around the exposed section of these longer sleds.

(ii) Cable Management Panels

Figure 6:
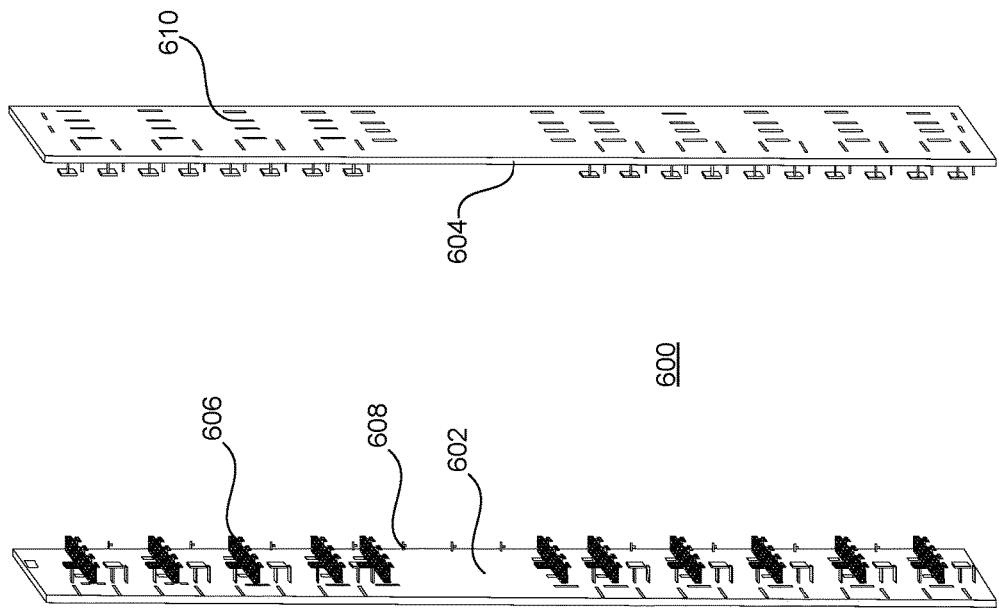
FIG. 6 illustrates an example set of modular cable management panels, which are expansion side panels designed with multiple ties that can be utilized to secure communication cabling extending to and/or from the IT gear at vertical locations along the front or back of the rack chassis.

According to another aspect of the disclosure, the modularity of MSE RIHS 100 includes further extension of the functionality of the expansion side panels 500 to provide component cable management and/or physical security. Referring to FIG. 6, there is illustrated an example of cable management panels 600 designed for use with the example rack chassis 202 of RIHS 100, according to one embodiment. As shown, cable management (CM) panels 600 include a left CM panel 602 and a right CM panel 604. In the illustrated embodiments, each CM panel 602, 604 is shown having a length and width that allows for a single CM panel 602 or 604 to provide the required functions of a corresponding expansion panel 602, 604 in order to provide the shielding required for the longer depth IT gear that can be inserted into the rack chassis 202. It is however understood that cable management panels 600 can have varying dimensions depending on a specific need and or design preference, including, but not limited to, an understanding of the depth of IT sleds being supported by the rack chassis 202. Cable management panels 600 can be made from a metal, metal alloy, molded plastic or other material that has sufficient tensile and other strengths to allow cable management panels 600 to support tying of cables thereto and multiple attachments (attaching and subsequent removing) of CM panels 600 with opposing side panels 212, 214 of the rack chassis 202. As further shown, each cable management panel 602, 604 includes a plurality of straps 606 that allows for a cable to be temporarily attached to the panel. The straps 606 can be a string, pliable metal, a Velcro-based strap, or some other form of restraint that is suitable for holding together a collected and/or grouped bunch of communication and power cables that are utilized by or inserted into the IT gear within the RIHS 100. Cable management panels 600 are also designed with a plurality of connecting mechanisms 608 that collectively enable cable management panels 600 to be securely affixed to the attachment affordances of corresponding opposing side panels 212, 214 of the rack chassis 202.

Cable management panel 600 offers an alternative to a moveable sleeve to support larger depth IT gear by serving as both (i) an expansion panel and (2) a cable management device. As an expansion panel, cable management panel 600 can be fixably attached to the opposing side panels 212, 214 to extend the entire depth of the rack chassis volume to accommodate the longest possible IT sled. Each cable management panel 600 is designed with a plurality of slots 610 (which can be simple perforations or holes) that serves as the cooling channels for lateral flow of air across the extended part of the IT gear that extends between the cable management panels 602, 604. The number of straps 606 can be variable and depend in part on one of user choice and design specifics. As is further shown by FIG. 6, cable management panels 600 can be designed with holes that enable the system IT personnel to attach the required number of straps 606 at the required locations of the IT gear after the cable management panels 602, 604 are attached to the rack chassis 202. The IT personnel can then insert the straps 606 to the locations that cable management is required, e.g., adjacent to locations along the rack chassis 202 in which an IT gear is provided on a corresponding IT sled. The cable management panels 602, 604 can be constructed with sheet metal or solid plastic or some other lightweight, durable material. In one embodiment, the indicated straps 606 are made of rubber or some form of plastic so as to be sufficiently pliable to be extended around the cables and secured at their ends. Cloth or other textile ties are also possible, as are pliable metal ties. Use of Velcro or other fastening material can also be integrated into the ties, in one or more embodiments.

As with the expansion side panels 500, the cable management panels 600 provide EMI protections for the exposed IT gear extending beyond the opposing side panels 212, 214. It is appreciated that both expansion side panels 500 and cable management panels 600 can be deployed as segments to allow for a modular application of these panels at a block level, such that only blocks having elongated IT gear are configured with segmented pairs of the corresponding panels 500 or 600, while no panels are provided (or extended) for other blocks having IT gear that does not extend beyond the normal depth of the front section 204 of rack chassis 202. Additionally, while illustrated and described with reference to the front section 204 of rack chassis 202, use of either type of panels 500 or 600 can also be supported for rear section 206 of rack chassis 202.

Figure 7:
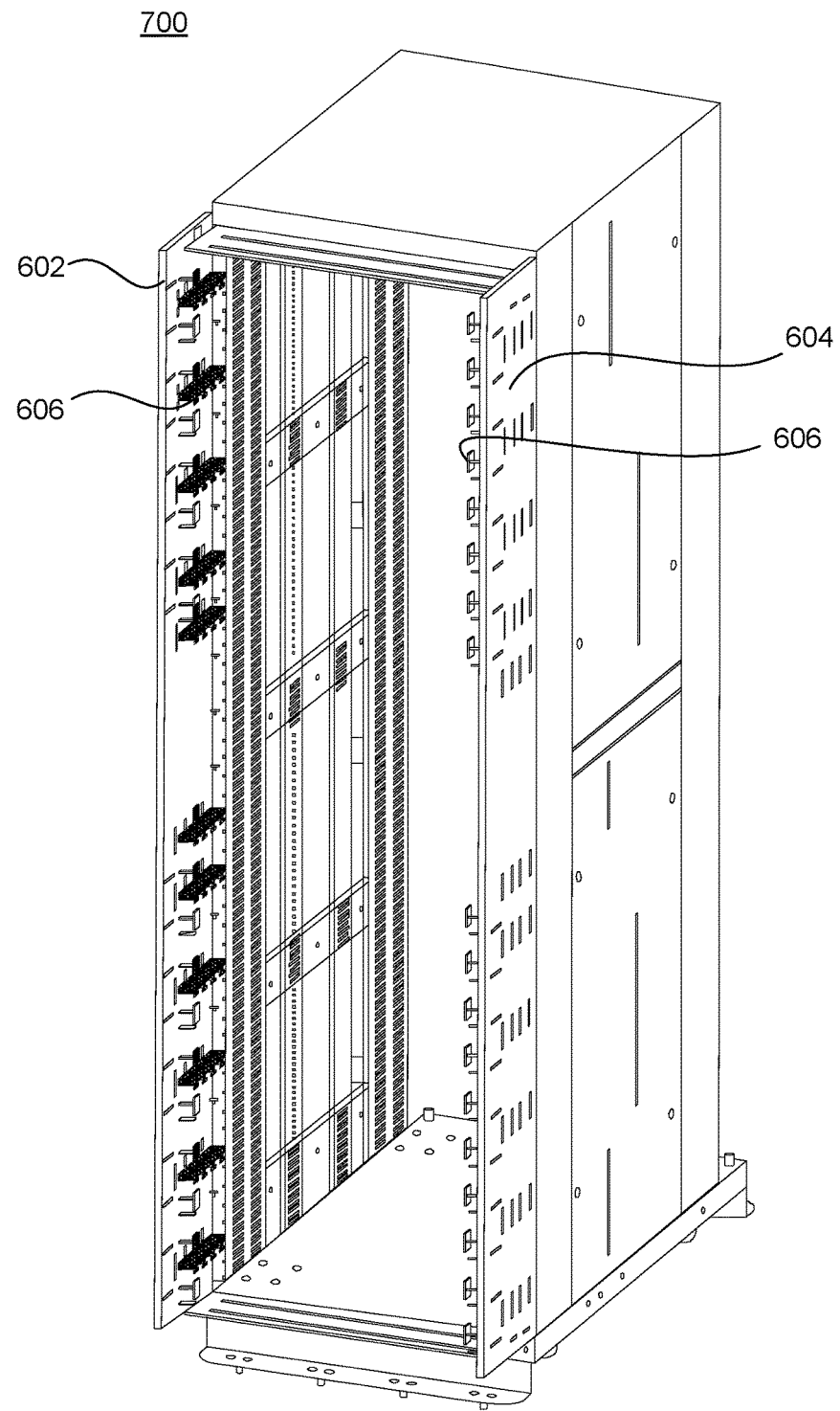
FIG. 7 illustrates the rack chassis with the cable management panels attached to the front side casing, according to one embodiment.

FIG. 7 illustrates an example rack chassis 700 having a pair of full length cable management panels 600 attached to front section 204 of opposing side panels 212, 214. As shown, cable management panels 602, 604 are respectively affixed to opposing side panels 212, 214 of rack chassis 202 as earlier described. In addition, each cable management panel 602, 604 includes multiple cable straps 606 that can be utilized to physically tie the power and communication cabling that can extend to and/or from the IT gear placed inside of the rack chassis 700 and particularly those cables that extend along the front of the rack chassis 700. Referring also to FIG. 8, there is shown an example use of the cable management panels 600 and particularly straps 606 within a RIHS 800 having IT gear 820 inserted into the rack chassis 202. FIG. 8 illustrates a specific example of the use of cable management panels 602, 604 within an RIHS 800 that is configured with multiple half-width IT gear 820 vertically arranged within the rack chassis 202, which is configured with cable management panels 602, 604. Each of the IT gear 820 includes a plurality of Ethernet or other communication cables 810 inserted therein and extending outwards from the IT gear 820. A group of these communication cables 810 are bunched together and tied with one of the straps 606 at a closest one of cable management panels 602, 604. As shown, the use of cable management panels 602, 604 allows for a more orderly arrangement of the communication cables 810 versus having all of the cables simply hang down the front access space 212 of the rack chassis 202. Notably the straps 606 are aligned relative to the vertical locations where the Ethernet and other communication cables 810 are receive by the IT gear 820. These cables extend along the inside of the cable management panels 600 away from the front access space 212 of rack chassis 202. As further shown, one end of the cables 810 terminates within switch 304 (FIG. 3) located in the area of the power and management bay, which were described and/or introduced in FIGS. 2-4. With FIG. 4, a fully inserted fan module within a fan bay at a back section 206 of the rack chassis 202 can result in the protrusion of the fan module. In at least one embodiment, a similar set of cable management or expansion side panels can be affixed to the back section 206 of the rack chassis 202 to accommodate longer fan bays and/or corresponding fan modules.

Figure 9:
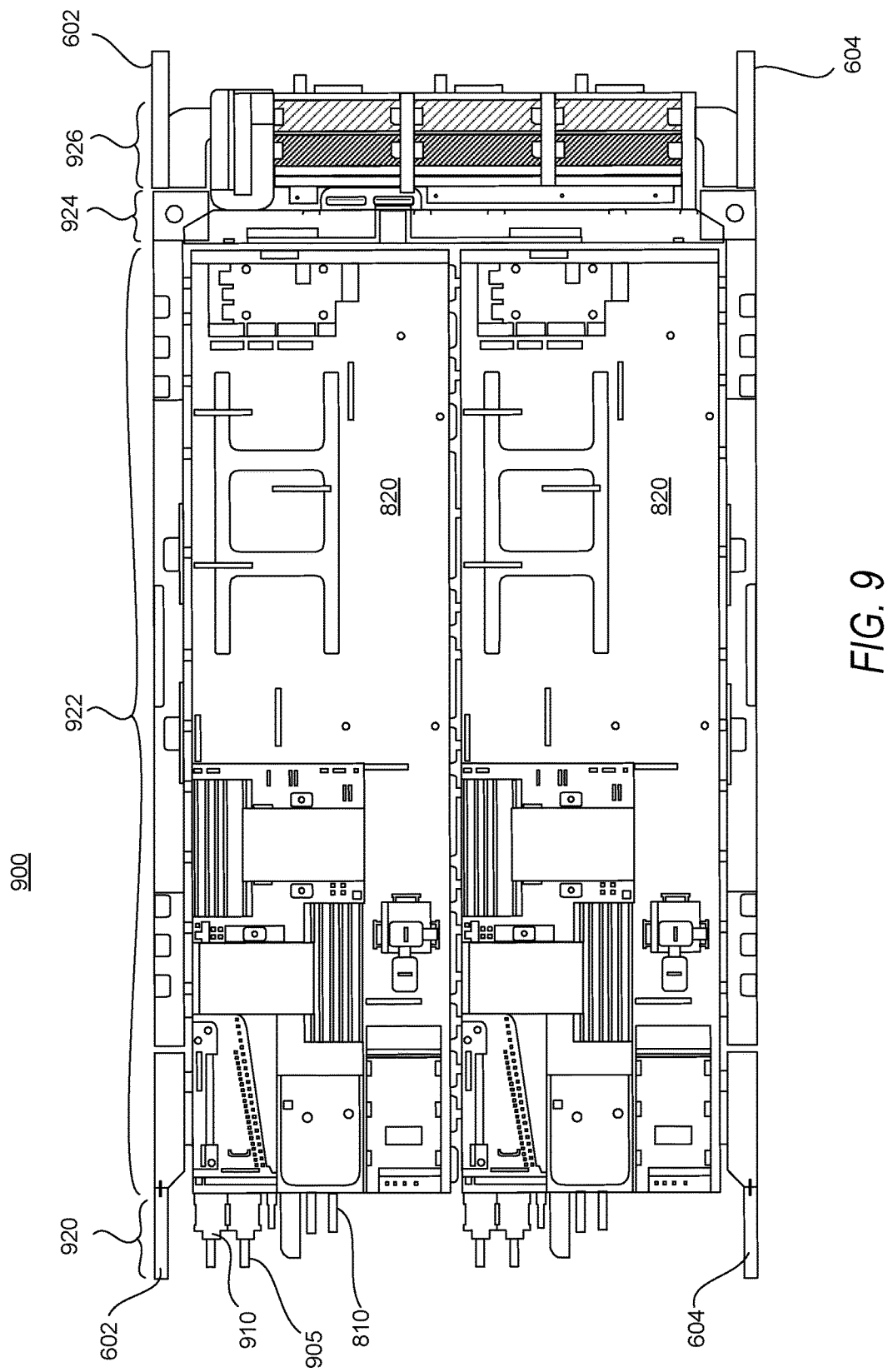
FIGS. 9-11 illustrate use of cable routing channels to manage the routing of power cables within the power and management module inserted into the power bay of the rack chassis, according to several embodiments.

FIG. 9 provides a horizontal cross sectional view 900 of layout of rack chassis 202 complete with a pair of half-width IT gear 820 and configured with a pair of cable management (CM) panels 600 attached at both a front section 204 and a back section 206 of the rack chassis 202. As illustrated in the cross-sectional view, two side-by-side half width nodes 820 extend from a front of the rack chassis 202 to a back of the rack chassis. The cross section indicates a number of zones, including from left to right, a cable zone 920, a sled chassis zone 922, a busbar zone 924, and a fan zone 926, each having respective depths within the rack chassis 202. For example, the cable management zone 920 and fan zone 926 can each be 115 mm in depth, in one implementation. At the front section 204 of the rack chassis 202 are two expansion panels 502 and 504, which are assumed to be CM panels 602, 604. When attached to opposing side panels 212, 214, each of expansion panels 500 and cable management panels 600 extend past a normal front edge of the front section 204 of rack chassis 202. In the illustrative embodiment, the attached CM panels 602, 604 provide a 115 mm depth cable zone at the front of the rack. Also, as illustrated, each of the half-width nodes have power plugs 905 inserted therein with power cables 910 extending therefrom.

Figure 10A:
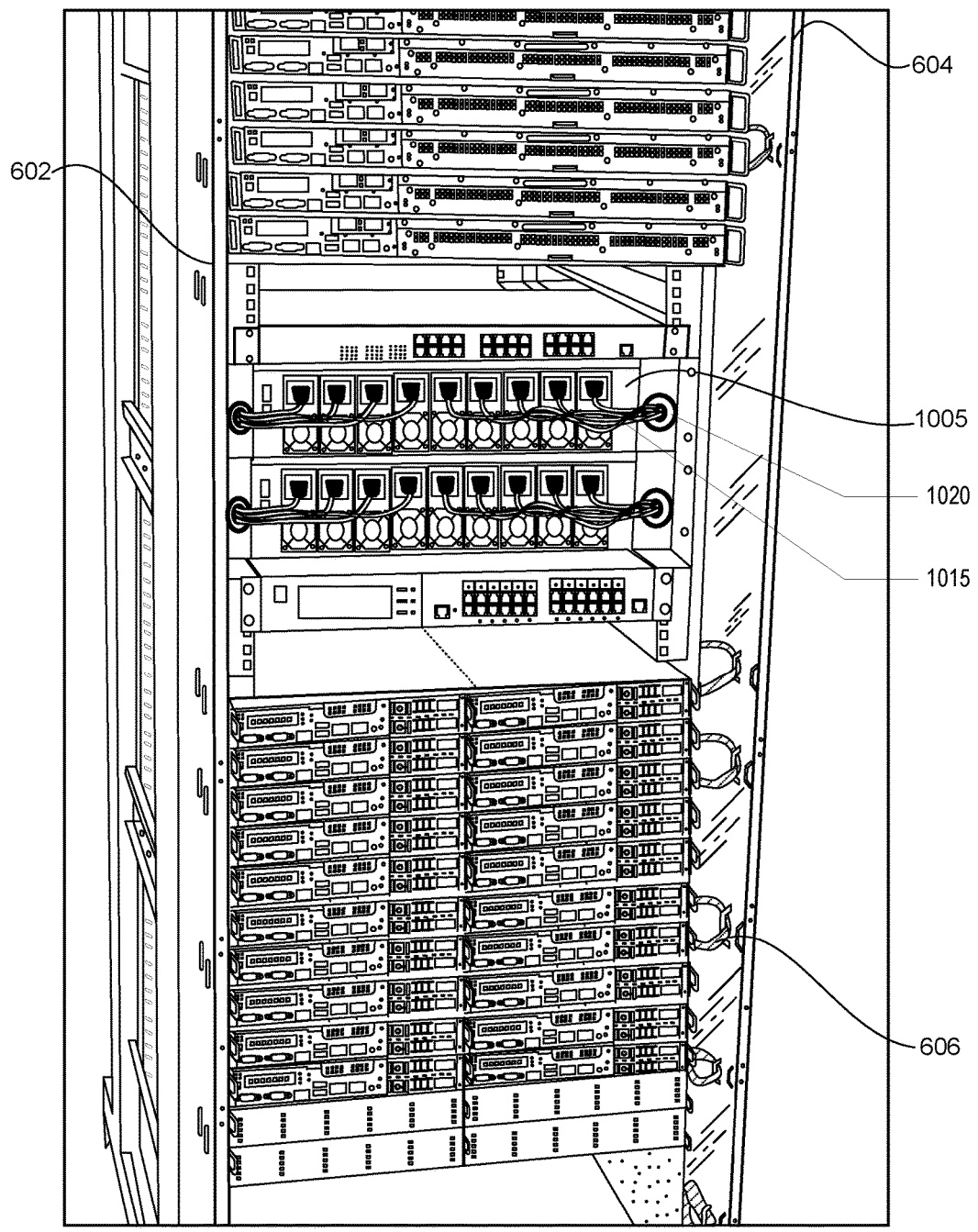
Figure 10B:
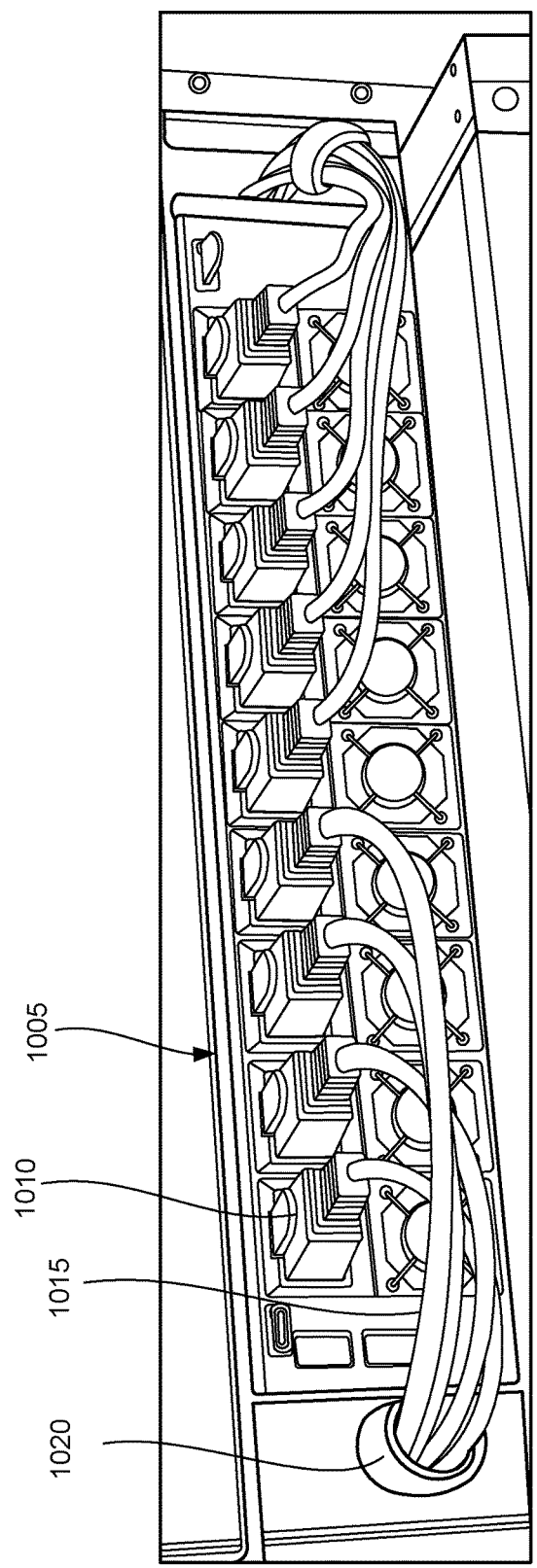

In addition to the use of CM panels 602, 604, example RIHS 800 also includes other methodologies for managing the run of cables. FIGS. 10A-B illustrate a specific example of managing the power cables that plug into the power supply units (PSUs) of the power and management module (PMM) 1005 that is inserted into the power and management bay 310 (see FIG. 3-4) of example RIHS 1000. As shown by FIGS. 10A-B, the plugs 1010 of the power cables 1015 are plugged into the power receptacles of the PSUs (not shown). The power cables 1015 then extend backwards down the sides of the PMM 1005 through cable routing channels (see FIG. 11 and description which follows), indicated by the two side holes 1020 shown within the PMM 1005. In addition to the power modules and switch modules 134 within the power and management bay 310, RIHS 1000 includes a plurality of IT gear, including full width IT gear, located above the power and management bay 310 and half-width IT gear, located below the power and management bay 310. Additionally, RIHS 1000 also includes cable management panels 602, 604 and corresponding ties 606 that can be used to manage communication cables (not shown) utilized by the various IT gear.

(iii) Sled Level Cable Management

Figure 11:
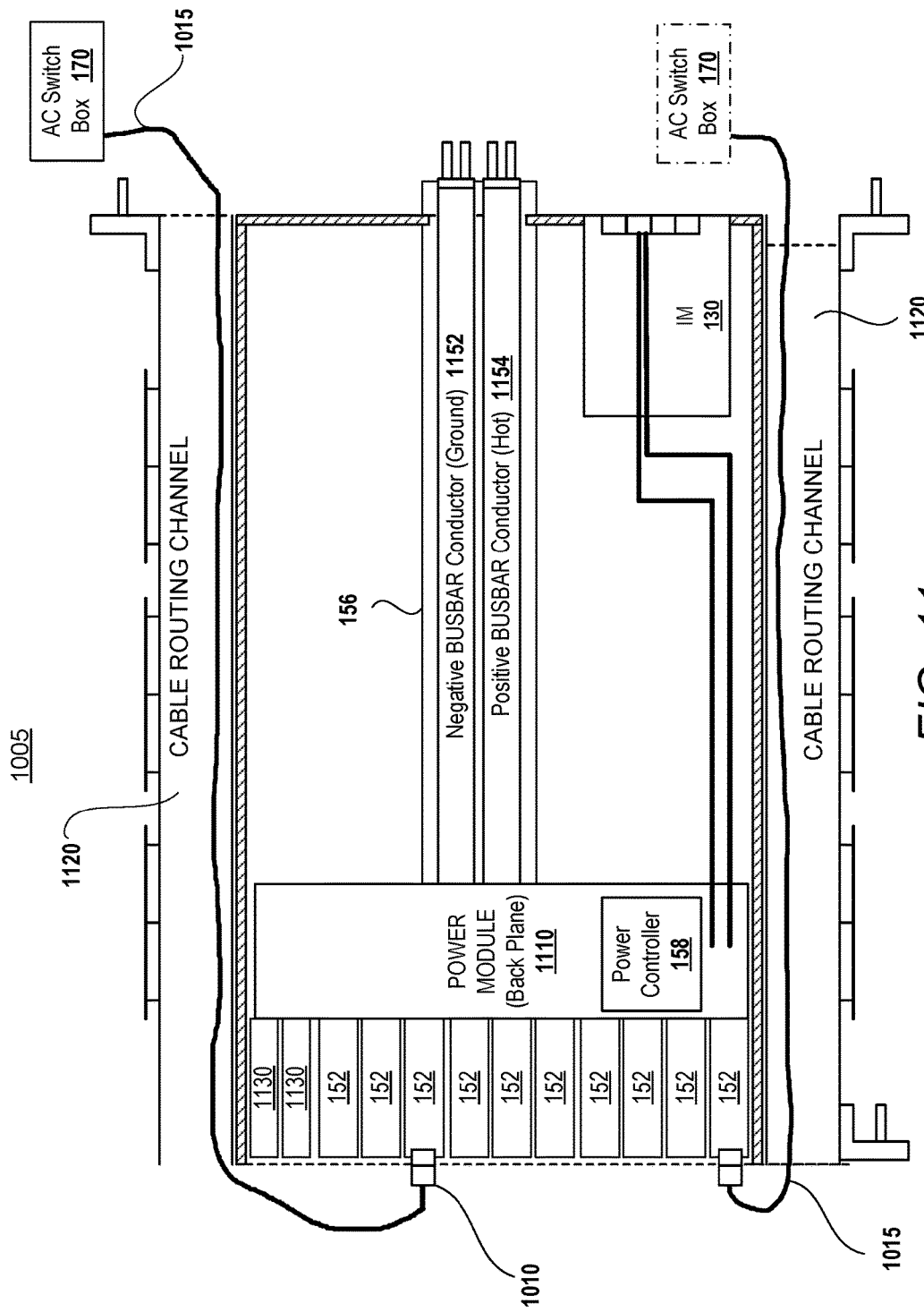

FIG. 11 shows an internal view of the design of the PMM 1005. As shown, PMM 1005 includes a plurality of PSUs 152 connected to a power module 1110 that provides power to the various IT gear outside of the power bay 310 through a segmented, modular bus bar 156, having negative and positive busbar conductors 1152, 1154. Also included in PMM 1005 is infrastructure module (IM) 130 whose functionality has been described with reference to FIG. 1. Finally, to support and/or manage the power cables 1015 utilize to supply AC power to PSUs 152, PMM 1005 includes two cable routing channels 1120, which extend from the front to the rear of the PMM 1005 on either side of the PMM 1005. Power cables 1015 are run from AC switch box 170 to the PSUs 152 through cable routing channels 1120. Thus with the exception of the short run of power cables 1015 from the corresponding plugs 1010 into the PSUs 152, the remaining run of power cables 1015 are hidden from view within RIHS 1000.

Figure 12:
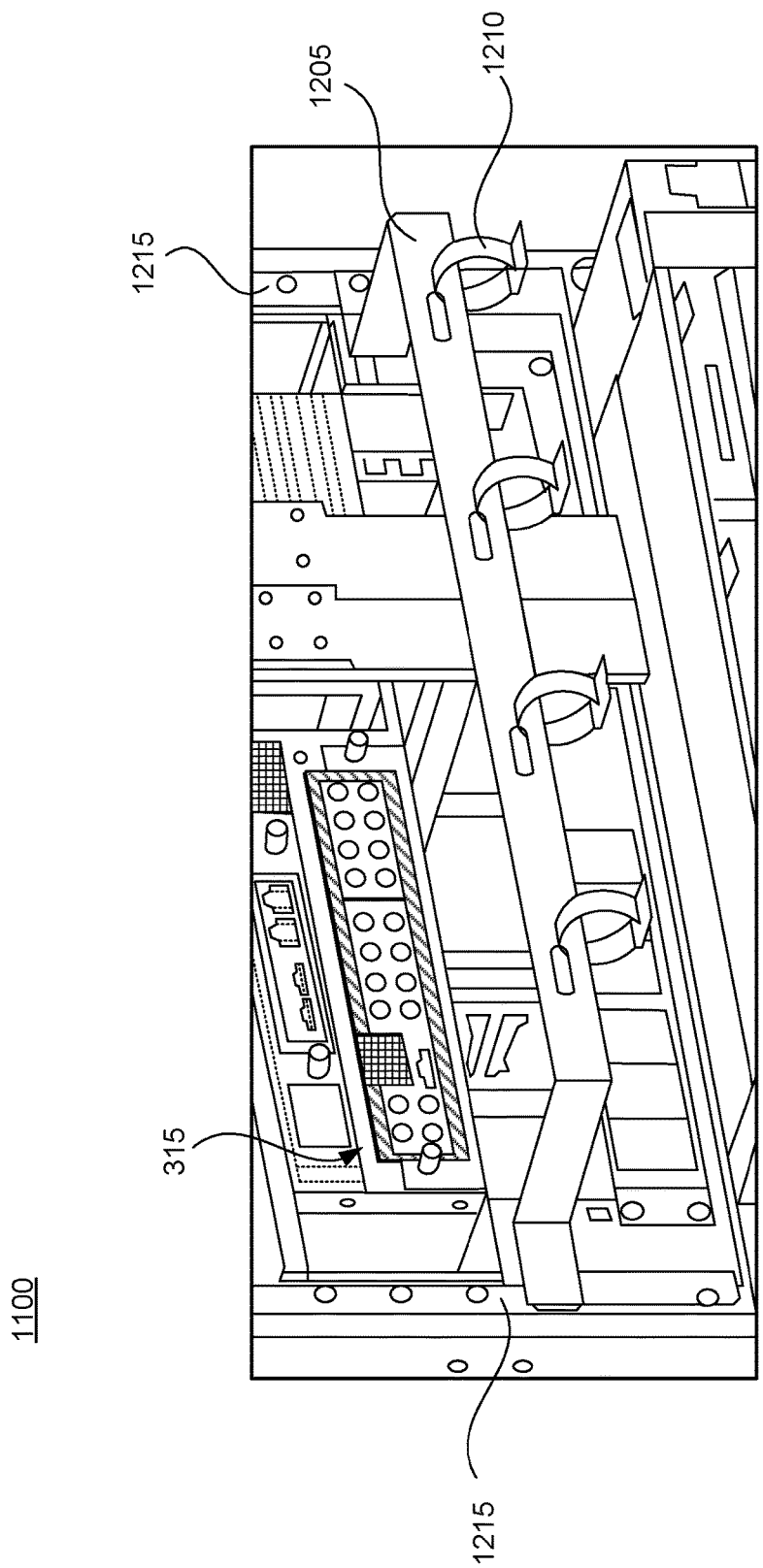
FIG. 12 illustrates an example cable management bar that can be attached horizontally to the rear of the rack chassis to provide cable management for cables that extend to the rear of the rack chassis, in accordance with one or more embodiments.

FIG. 12 provides one additional cable management attachment to the rack chassis 202. As shown, a cable management bar 1205 is extended horizontally across the power and management bay area at the rear of the rack chassis 202 to allow for management of the various power and communication cables that extend to and from the switch module/s and/or other power module/s. Cable management bar 1205 is fixably attached at opposing end frames of the rack chassis 202. Cable management bar 1205 includes a plurality of tie locations identified by slots or holes within the cable management bar 1205. Adjustable and/or reusable straps 1210 are shown placed within each of the holes. These straps 1210 are utilized as needed to secure the power and other cables utilized within the rear of the RIHS 100. It is appreciated that different types of cable management can be implemented using different configurations of peripheral attachments at the front or back of the rack chassis 202.

Figure 13:
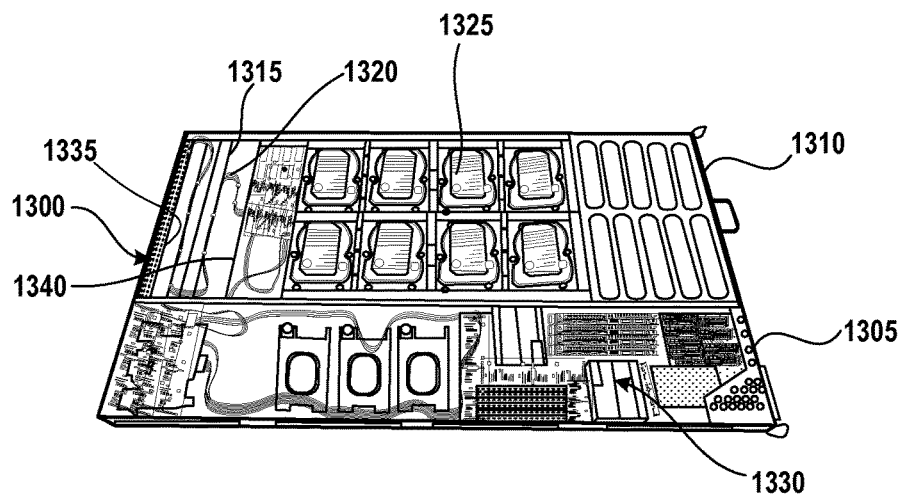
FIGS. 13-14 illustrates use of a retractable cable arm within an IT sled to provide cable management at the sled level and support hot serving of the IT gear, according to one or more embodiments.
Figure 14:
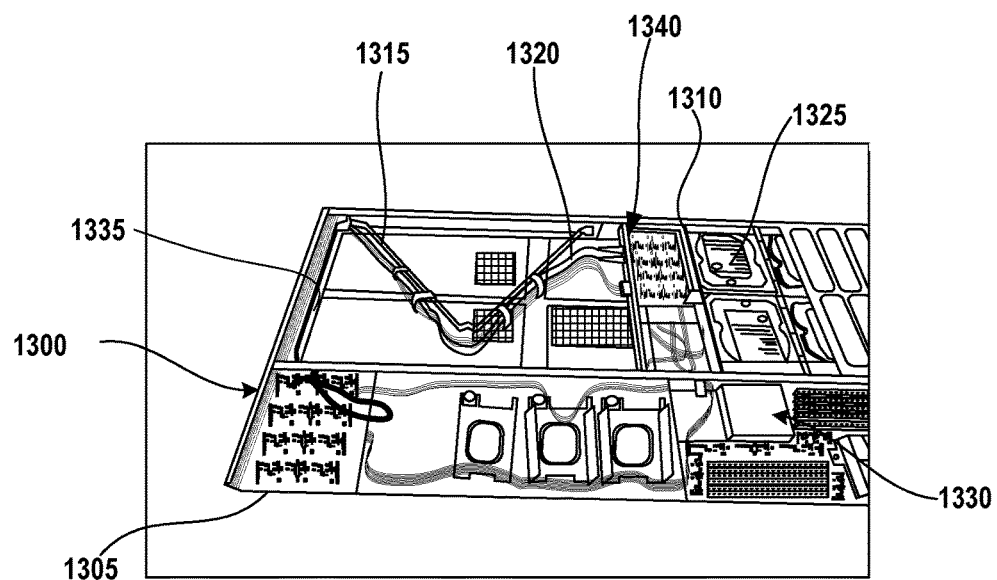

In additional to the above introduced cable management internal to the PMM module, in one or more embodiments, the sled of the IT gear can be configured to include the relevant internal cabling such that each sled can operate independently and be fully powered and functional while in a service location (i.e., extended from chassis). FIGS. 13-14 illustrate one example of the configuration of a storage sled designed for use within the RIHS 100. Generally, storage sled 1300 includes a stationary tray 1305 and a moveable tray 1310. The moveable tray 1310 is slideably received within the stationary tray 1305 of the storage sled 1300. In order to facilitate extending the moveable tray 1310 from a closed position to a service position, storage sled 1300 is configured with a cable extension arm 1315. One or more flexible power and signal cables 1320 reside in the stationary tray 1305 and are lengthwise attached to the cable extension arm 1315. The cable extension arm 1315 includes two or more arm segments that are pivotally attached to one another. A first terminal end of cable extension arm 1315 can be pivotally attached to an inner, rear wall section 1335 of the stationary tray 1305. The second, opposing terminal end of the cable extension arm 1315 is attached to an outer, rear wall section 1340 of the moveable tray 1310. The cable extension arm 1315 is positioned to be moveable between a stowed or collapsed position and a service or extended position, respectively corresponding to the stowed position (FIG. 13) and the service position (FIG. 14) of the moveable tray 1310. The one or more flexible power and signal cables 1320 extend from the IT components 1325 located within the moveable tray 1310 to the other IT components 1330 of the sled within the stationary tray 1305 along the path of the cable extension arm 1315. Other functional components 1330, such as storage controllers, may reside in the stationary tray to communicate with and functionally support the IT components 1325 located in the moveable tray 1310. The specific example of storage sled 1300 having hard disk drives as the IT components 1325 is solely for example. Other IT sleds containing different IT gear can also be designed with the similar functionality of a cable extension arm to support serviceability of the IT components.

Thus according to one aspect of the disclosure, provided is a RIHS 100 having a rack chassis 202 including at least one IT gear inserted therein and having one or more communication and/or power cables extending therefrom. The RIHS 100 includes opposing side panels 204, 206 at a front opening of the RIHS 100, which are attached to or an extension of the rack chassis 202, extending past the front end of the at least one IT gear. Included in/on the opposing side panels are one or more cable management attachments. The cable management attachments enable secure holding of the cables extending from and/or running into the at least one IT gear so that the cables are not loosely located within the front opening. In one embodiment, the opposing side panels include perforated holes or connectors and the cable management attachments include zip ties inserted into the perforated holes. In other embodiments, the cable management attachments are fixably attached as permanent structures on the side panels. The cable management attachments enable rack-level cable management at the front and/or back of the rack and enables easier access to the IT gear without being blocked by or having to content with the loosely running mass of cables. In one embodiment, a similar attachment of side panels is provided at the rear opening of the rack, and these side panels are further configured with cable management attachments to support cable management at the rear of the rack chassis 202. The cables that can be managed using this configuration of cable management attachments include, but are not limited to, power cables, communication cables, such as Ethernet and Fiber cables, and the like.

The above-introduced designs and configurations of RIHS 100 provide various mechanisms to accommodate and manage the cables within the RIHS 100. According to one aspect, the rack chassis 202 is made of a structural frame that allows for scaling of accessories and attachments, as needed for the particular deployment. With this modular design can be provided cable management attachments or accessories and security screens, among other accessories that can be affixed to the structural frame or inserted within the rack chassis. The cable management attachments can be assembled to the front or rear of the rack, as needed, and can be available in many different sizes. Further the cable management attachments can be colored or color-coded to identify the type of cable that the attachment is designed to secure. The cable management can also include other features that can be sized for different cable types and configuration. In one embodiment, the side panels are cable management panels and can contain one or more contained and exclusive paths for uplinks to the data center. As provided by the illustrative embodiments, the cable management panels are not structural, and the panels can be added, removed, or swapped at any time with the IT gear already installed within the rack.

B. Security Screens

Figure 15:
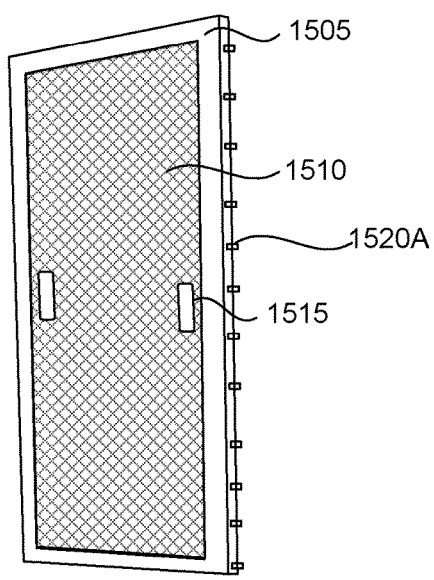
FIG. 15 provides examples of a modular security screen configured to attach to the side panels of the rack chassis, in accordance with one embodiment.
Figure 15:
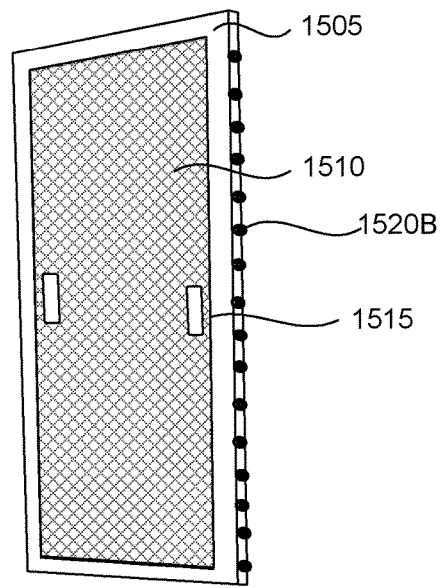

As one additional aspect of the modularity of the RIHS 100, one or more embodiments provide a modular application of security screens. These security screens can be utilized for protecting the processing nodes and/or preventing access to the processing nodes or other IT gear or components located at the front of the RIHS 100. Additionally, the security screens can also be utilized to protect and/or prevent access to components at the back of the RIHS 100, such as the fans and the power bay and switch bay components. Referring first to FIG. 15, there are illustrated two views of an example security screen 1500 designed to be utilized with RIHS 100. Security screen 1500 includes an exterior border 1505 made of a material that has sufficient rigidity and strength to allow security screen 1500 to maintain its general shape. As provided, example security screen 1500 is shaped as a rectangular panel in order to fit on the rectangular opening at the front of a rack chassis 202 of an example RIHS 100. It is however appreciated that security screen 1500 can be configured with different shapes and sizes, in alternate embodiments. Security screen 1500 further includes a mesh-like face 1510 located central to the exterior border 1505. Mesh-like face 1510 is configured with a plurality of holes or perforations to allow for passage of air (i.e., air flow) through the face (1510) of the security screen 1500 when the security screen 1500 is affixed to example RIHS 100/300. The actual porosity, size, and number of holes or perforations within security screen 1500 can vary. The face (1510) of security screen 1500 thus presents a mesh or mesh-like appearance, in the illustrative embodiment. Along one or more of the sides and/or the back surface of side exterior border 1505 of security screen 1500 can be one or more grooves or connecting affordances 1515. These connecting affordances 1515 enable security screen 1500 to be physically affixed to one of (a) the opposing side panels 212, 214 of RIHS 100, (b) the expansion side panels 500, or (c) cable management panels 600.

In order to support attachment of security screen 1500 via attachment affordances 1515, side panels 212, 214 are designed with one or more connecting affordances 1515 along the outside of or on the surface edge of side panel 212, 214 (see FIG. 2). Connecting affordances 1515 of security screen 1500 can then be slideably inserted into or snapped into or otherwise fixably interconnected with these connecting affordances 1515. The combination of the attachment affordances 1515 and consistent design of the connecting affordances 1515 enables the security screen 1500 to be securely held in place over the surface edge of the side panel 212, 214. Once affixed at one side panel (e.g., left panel 212), the security screen 1500 can be snapped onto the other, opposing side panel (e.g., right 214) using similar connecting mechanisms. In one alternate embodiment, the side panel 212 may be configured with slots for fixably inserting pin extensions extending from the security screen 1500. It is appreciated that other methods and mechanisms for attaching security screen 1500 to side panels 212, 214 of RIHS 300 are possible, and that the examples presented herein are but a subset of these various methods and mechanisms, which provide an equivalent function to the specific example methods and mechanism presented herein. Within the face 1510 of security screen 1500 are one or more grooves or gripping affordances 1520a-b, which allow a user to grip onto and manually detach security screen 1500 from the RIHS 300.

Figure 16:
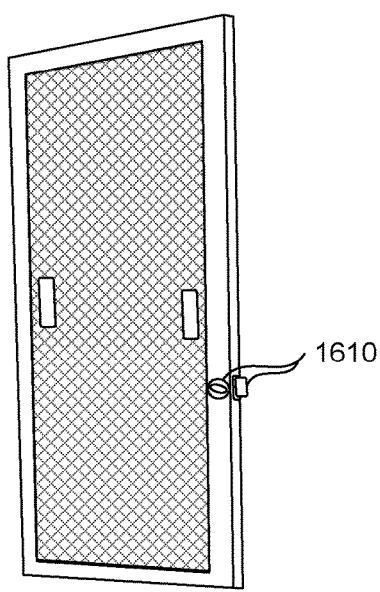
FIG. 16 provides additional examples of a modular security screen configured to attach to the side panels of the rack chassis, with a locking mechanism to securely lock the screen in place over IT gear inserted within the rack chassis behind the security screen, in accordance with one embodiment.
Figure 16:
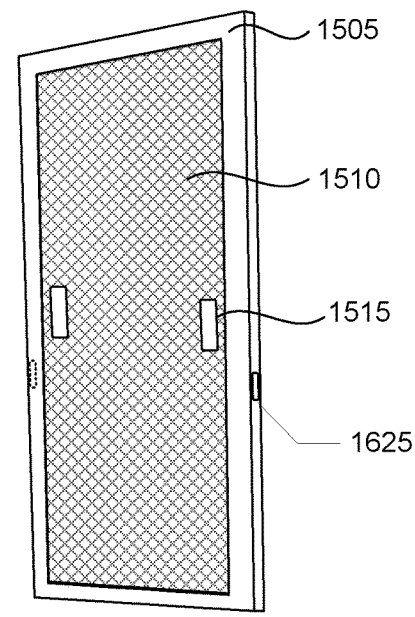

Referring to FIG. 16, as an additional security aspect, lockable security screens 1600, 1620 can be provided to include a similar base structure of security screens 1500, but configured with a locking mechanism 1610. Locking mechanism 1610 can be a passive locking mechanism that allows manual locking, using a tie or wire or string, for example, to be used to secure the security screen 1600 to the side panel 212, 214 of rack chassis 202. Alternatively, locking mechanism 1610 can be an active or actual locking mechanism such as a keyed lock that requires insertion of a physical key to operate or unlock. This implementation is illustrated by the example figure. Whether a passive locking mechanism or an active locking mechanism is utilized, the locking mechanism operates such that an outward pull or prying of the security screen, whether at the side panels 212, 214 or using the finger groove/grip areas 1520a-b does not dislodge the security screen 1600 from the side panels 612, 614 of the RIHS 300.

Figure 17:
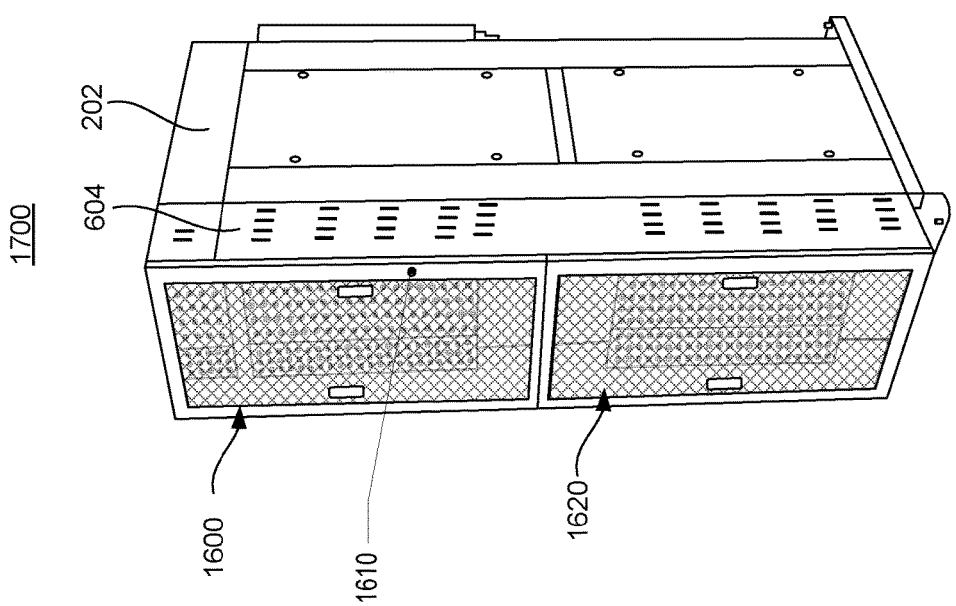

The security screen 1500 thus extends horizontally across the internal space between the two side panels 612, 614, in front of the various components that are placed within the rack chassis 202. FIG. 17 illustrates an example of a RIHS 1700 having two security screens, namely lockable security screen 1600 and non-lockable security screen 1620 (similar to 1500), affixed to the front opening of the rack chassis 202 of RIHS 1700.

In order to support use of locking mechanism 1610, one or both of the side panels 612, 614 of RIHS 1700 is designed with a lock receptacle into which the extension member of the locking mechanism 1610 fits to enable the locking function of the locking mechanism 1610. An alternate embodiment (not shown) provides for inclusion of the locking mechanism 1610 within the cable management panels 612, 614, with the security screen 1620 being specifically designed with at least one slot 1625 to receive the physical locking extension member in order to physically lock the security screen 1620 to the chassis 202 of the RIHS 100.

Figure 18:
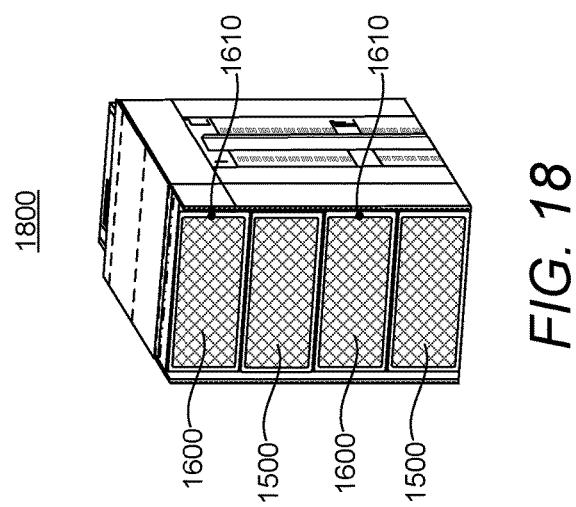
FIG. 17-18 provides two example RIHSes illustrating a front opening having different modularity of security screens attached to the side panels of the rack chassis, in accordance with multiple embodiments.

FIGS. 17-18 shows an extension of this use of security screens within two example RIHSes 1700, 1800. As one aspect of the modularity of the design of the RIHS 100 and by extension the security screens 1500, 1600, multiple, smaller-sized security screens 1500, 1600 can be provided to provide the ability to treat each block of nodes within the RIHS 1700 as an independent group of processing components that can be individually assigned security screens. The type of security screen (lockable versus un-lockable) assigned to a specific block of IT gear can be granularly determined based on what security protections a specific block of processing components requires, without having to treat all blocks the same from a security perspective. Within this context, security refers to preventing the physical removal of the components from the RIHS 100 when the RIHS 100 is deployed outside of a controlled area or when limited access is desired for certain components within the RIHS 100, regardless of the deployment specifics (i.e., within or outside of a control area). FIG. 17 illustrates a first RIHS 1700 configured with two security screens, one regular screen 1500 and one lockable screen 1600. The use of these two screens 1500, 1600 separates the upper section of the RIHS 1700, above the PMM bay, from the lower section of the RIHS 1700. Thus, the IT personnel can place IT gear requiring access restrictions to the upper section, which can be locked by lockable security screen 1600, and can place other IT gear that do not require that level of security to the lower section, which is configured with only a (non-lockable) security screen 1500.

A more granular, block level application of security screens can also be supported, in one or more embodiment. As shown by FIG. 18, each block of processing nodes is provided its own security screen. The first and third blocks are provided lockable security screens 1600, with respective locking mechanism 1610, while the second and fourth blocks are provide with non-lockable security screens 1500. By allowing the granularity of block-level security screen protections, different blocks of physical components can be assigned different priorities within the RIHS 1800 from a security perspective. For example, the storage device blocks can be considered more secure than an adjacent block of processing nodes because of the nature of data being stored. Thus the block of storage devices (or storage device sleds) is provided with a lockable security screen 1600, while the vertically-adjacent block of processing nodes are provided with a non-lockable security screen 1500.

Thus, in accordance with the above described aspect of the disclosure, there is provided a rack assembly for physically supporting a rack-configured information handling system (RIHS). The rack assembly includes: an external casing comprising at least two opposing panels extending in a first direction and which are structurally held in place by one or more segments spanning between the two opposing panels to generate an internal volume between the at least two opposing panels, the internal volume having one or more structures that enable insertion and retention of information technology (IT) components of the RIHS. The rack assembly further includes at least one security screen that is removably affixed to opposing edges of the two opposing panels. The security screen operates as a shield that prevents physical access to the IT components inserted within a space extending behind the security screen, while the screen is affixed. According to at least one embodiment, the security screen is a mesh screen that allows air to pass through for cooling of the IT components located in the space. In one or more embodiments, the security screen includes a locking mechanism that securely affixes the security screen to the opposing edges of the two opposing panels. The locking mechanism further prevents removal of the security screen and/or prevents access to the space behind the security screen. In one embodiment access is restricted unless a key or unlock code is provided to unlock the locking mechanism.

The locking mechanism can be a physical lock, which requires a physical key or the locking mechanism can include a digital lock, which requires a digital key or entry of a code. With one implementation, the locking mechanism can be communicatively affiliated with the IT component/s within the protected space. Then, the digital key can be linked to the IT component within the space such that the digital key has to be verified and confirmed by the IT component prior to unlocking the locking mechanism.

In one or more implementations, the two opposing panels can further include one or more indentations within a first external edge of each of the two opposing panels. Then, the opposing edges of the security screen are slideably inserted into the one or more indentations of the two opposing panels. Additionally, in one embodiment, the two opposing panels further include a physical stop to hold a panel at a specific location along the extended run of the edge of the panel. Also, at least one of the opposing panels includes a locking affordance that enables the security screen to be securely locked in place via a locking mechanism.

Within the physical structure of the rack assembly, the at least two opposing panels extend vertically from a base to a top of the rack; and the one or more segments are horizontal segments that span across from a first vertical panel to a second vertical panel and are affixed at opposing ends to the first vertical panel and the second vertical panel to create a vertically extended volume of the rack. The vertically extended volume provides multiple component units of space for horizontal insertion of multiple different IT components in a vertical configuration within the vertically extended volume. With this configuration of the rack, the security screen is positioned within a front area of the vertically extended volume at which the IT components are slideably inserted.

In one embodiment, multiple different security screens are attached to the rack and at least one of the security screens include a locking mechanism. When the IT components are vertically grouped to provide multiple different IT blocks that can have different access and security considerations, the rack can be configured with multiple different security screens, with each security screen sized to cover a specific number of component units and each security screen being separately insertable to cover a specific one or more IT blocks. Additionally, in one or more embodiments employing multiple security screens, the screens are each separately/independently lockable, with some or all of the screens having its own locking mechanism and/or unlock code. With this configuration of independently lockable security screens, each IT block separated by a different security screen can be selectively locked or unlocked using security screens having the locking mechanism.

In addition to or independent of the security screens, the rack assembly can also include an expansion panel or a cable management panel affixed to a front edge of each of the opposing panels and having a similar configuration as the opposing panels at the extended end to allow for fixable insertion and locking of the security screen on to the cable management panel. With this configuration, the security screen is affixed to the exterior edge of the expansion panel or cable management panel via coupling mechanisms of the cable management panel and/or of the security screen.

The above described mechanisms provide IT gear security that does not require permanent attachment to the rack chassis. The security screens 1500 can further be removed in sections, as needed, to only expose the IT gear that needs servicing or that is being physically accessed. And, the security screens 1500 can be individually locked, such that the RIHS can be provided with multiple lock codes for different protective screens within the same rack of IT gear. As an additional aspect, the security screen 1500 allows for protection and servicing of IT gear without requiring room for swept volume upon removal. Thus, unlike a traditional rack door that is hinged and requires swept volume to open, the security screen 1500 provided by the present disclosure simply slides or snaps onto the front of the rack and locks in place. These characteristics enable the security screen 1500 to operate in various different, limited-space, hot and cold aisle environments. As further illustrated and described, the security screen 1500 can be perforated for air flow through the IT gear. Importantly as well, the security screen can be made into multiple sections for applications where granular security zones are desired, with each security screen being able to be locked independently. Where the security zone is the entire RIHS, a single security screen can be deployed with one or more locking mechanisms as appropriate for the particular implementation. It is further appreciated that while the functional aspects of the utilization of the security screens 1500 is described from a front-of-rack perspective, these security screens can also be equally utilized to provide physical covering and/or security for accessing components at the rear of the rack, as well.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular system, device or component thereof to the teachings of the disclosure without departing from the essential scope thereof. Therefore, it is intended that the disclosure not be limited to the particular embodiments disclosed for carrying out this disclosure, but that the disclosure will include all embodiments falling within the scope of the appended claims. Moreover, the use of the terms first, second, etc. do not denote any order or importance, but rather the terms first, second, etc. are used to distinguish one element from another.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The description of the present disclosure has been presented for purposes of illustration and description, but is not intended to be exhaustive or limited to the disclosure in the form disclosed. Many modifications and variations will be apparent to those of ordinary skill in the art without departing from the scope of the disclosure. The described embodiments were chosen and described in order to best explain the principles of the disclosure and the practical application, and to enable others of ordinary skill in the art to understand the disclosure for various embodiments with various modifications as are suited to the particular use contemplated.

What is claimed is:

1. A modular, expandable rack assembly for physically supporting components of one or more information handling systems (IHSes), the rack assembly comprising:
    a rack chassis comprising a plurality of interconnected panels forming a volumetric space having a front section and a rear section, both with opposing side panels forming a front access space and a rear access space, respectively, between corresponding opposing side panels;
    a pair of front expansion panels that are added to the rack chassis and which extend past an end of the opposing side panels at the front section of the rack chassis to provide a deeper (information technology) IT bay within the front section and enable insertion of one or more longer depth IT gear sleds within the rack chassis;
    the one or more longer depth IT gear sleds that are inserted into the front section of the rack chassis and which extend beyond the end of the opposing side panels when fully inserted into the front section of the rack chassis, wherein the pair of front expansion panels flank an extended portion of the one or more longer depth IT gear sleds and provide shielding from electromagnetic interference (EMI) for the extended portion of one or more IT gears within the one or more longer depth IT gear sleds.

2. The expandable rack assembly of claim 1, wherein the pair of front expansion panels are retractable sleeves.

3. The expandable rack assembly of claim 1, wherein:
    the opposing side panels and front expansion panels respectively include attachment affordances and connection affordances to support interconnection of the front expansion panels with the opposing side panels; and
    the pair of front expansion panels are removably affixed via the connecting affordances to the opposing side panels in a fixed position that provides an extended depth of the front section of the rack chassis.

4. The expandable rack assembly of claim 1, wherein the front expansion panels are cable management panels which comprise:
    at least one strap attached to each of the cable management panels that is utilized to secure one or more cables extending from one or more IT gear inserted into the rack chassis, where the one or more cables are pulled out of a main section of the front access space towards a corresponding side of the front section;
    wherein the at least one strap is flexible and is made of a pliable material from a group comprising: a wire, a string, a textile, and a pliable plastic.

5. The expandable rack assembly of claim 4, wherein the cable management panels are segmented panels that are less than a total height of the rack chassis.

6. The expandable rack assembly of claim 1, wherein:
    the rack chassis comprises a plurality of guides located within interior surfaces of the opposing side panels at the front section, the plurality of guides running in a same longitudinal direction from the front section towards the rear section.

7. The expandable rack assembly of claim 1, wherein the pair of front expansion panels further comprise a plurality of perforations within a surface of the front expansion panels and which enable convection air cooling of the one or more IT gears within the extended portion.

8. The expandable rack assembly of claim 1, further comprising:
    a power and management module (PMM) having one or more power supply units (PSUs) and a management controller and which is inserted into a power bay of the rack chassis, wherein the PMM includes two cable routing panels located within interior sides of the PMM and which are utilized to route a plurality of power cables connecting each PSU at a front section of the rack chassis with an AC switch box located at a rear section of the rack chassis.

9. The expandable rack assembly of claim 1, further comprising:
    a cable management bar affixed to a back section of the rack chassis in a vicinity of a power and management bay of the rack assembly, the cable management bar having one or more straps connected to the cable management bar and which can be utilized to group and arrange one or more cables running in the vicinity of the power and management bay.

10. The expandable rack assembly of claim 1, further comprising:
    one or more IT sleds having a movable tray and a stationary tray, the IT sled further having a cable extension arm connected at one end to the moveable tray and at another end to an internal rear panel of the IT sled.

11. The expandable rack assembly of claim 1, further comprising:
    a pair of rear expansion panels that are added to the rack chassis and which extend past an end of the opposing side panels at the back section of the rack chassis to provide a deeper power and fan bay within the back section and enable insertion of longer depth fan modules within the fan bay.

12. A rack-based information handling system (RIHS) comprising:
    a rack chassis having a plurality of interconnected panels forming a volumetric space having a front section and a rear section, both with opposing side panels forming a front access space and a rear access space, respectively, between corresponding opposing side panels;
    one or more longer depth information technology (IT) gear sleds that are inserted into the front section of the rack chassis and which extend beyond an end of the opposing side panels when fully inserted into the front section of the rack chassis; and
    a pair of removable front expansion panels that are added to the rack chassis and which extend past the end of the opposing side panels at the front section of the rack chassis to provide a deeper IT bay within the front section and enable insertion of the one or more longer depth IT gear sleds within the rack chassis, wherein the pair of front expansion panels flank an extended portion of the one or more longer depth IT gear sleds and provide shielding from electromagnetic interference (EMI) for the extended portion of one or more IT gears within the one or more longer depth IT gear sleds.

13. The expandable rack assembly of claim 11, further comprising:
at least a first sled of one or more IT sleds further including connecting and communication cables internal to the sled and affixed to the cable extension arm, wherein the connecting and communication cables remain attached to the cable extension arm to allow the movable tray to be extracted from the IT sled into a hot serviceable, open position and retracted back into the IT sled into a closed position.

14. The RIHS of claim 12, wherein:
the opposing side panels and front expansion panels respectively include attachment affordances and connection affordances to support interconnection of the front expansion panels with the opposing side panels; and
the pair of front expansion panels are removably affixed via the connecting affordances to the opposing side panels in a fixed position that provides an extended depth of the front section of the rack chassis.

15. The RIHS of claim 12, wherein the front expansion panels are cable management panels which comprise:
at least one strap attached to each of the cable management panels that is utilized to secure one or more cables extending from one or more IT gear inserted into the rack chassis, where the one or more cables are pulled out of a main section of the front access space towards a corresponding side of the front section;
wherein the at least one strap is flexible and is made of a pliable material from a group comprising: a wire, a string, a textile, and a pliable plastic; and
wherein the cable management panels are segmented panels that are less than a total height of the rack chassis.

16. The RIHS of claim 12, wherein the pair of front expansion panels further comprise a plurality of perforations within a surface of the front expansion panels and which enable convection air cooling of the one or more IT gears within the extended portion.

17. The RIHS of claim 12, further comprising:
a power and management module (PMM) having one or more power supply units (PSUs) and a management controller and which is inserted into a power bay of the rack chassis, wherein the PMM includes two cable routing panels located within interior sides of the PMM and which are utilized to route a plurality of power cables connecting each PSU at a front section of the rack chassis with an AC switch box located at a rear section of the rack chassis.

18. The RIHS of claim 12, further comprising:
a cable management bar affixed to a back section of the rack chassis in a vicinity of a power and management bay of the rack assembly, the cable management bar having one or more straps connected to the cable management bar and which can be utilized to group and arrange one or more cables running in the vicinity of the power and management bay.

19. The RIHS of claim 12, further comprising:
a pair of rear expansion panels that are added to the rack chassis and which extend past an end of the opposing side panels at the back section of the rack chassis to provide a deeper power and fan bay within the back section and enable insertion of longer depth fan modules within the fan bay.

* * * * *